US011605796B2

(12) United States Patent
Kim et al.

(10) Patent No.: US 11,605,796 B2
(45) Date of Patent: Mar. 14, 2023

(54) DISPLAY DEVICE

(71) Applicant: Samsung Display Co., LTD., Yongin-si (KR)

(72) Inventors: Seyong Kim, Asan-si (KR); Jin yong Sim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 43 days.

(21) Appl. No.: 17/071,943

(22) Filed: Oct. 15, 2020

(65) Prior Publication Data
US 2021/0119171 A1 Apr. 22, 2021

(30) Foreign Application Priority Data
Oct. 21, 2019 (KR) .................. 10-2019-0130473

(51) Int. Cl.
*G06F 1/16* (2006.01)
*H01L 51/52* (2006.01)
*H01L 27/32* (2006.01)
*H01L 51/00* (2006.01)
*E05D 7/00* (2006.01)
*E05D 3/18* (2006.01)
*E05D 3/12* (2006.01)

(52) U.S. Cl.
CPC .......... *H01L 51/5237* (2013.01); *E05D 3/122* (2013.01); *E05D 3/18* (2013.01); *E05D 7/00* (2013.01); *G06F 1/1652* (2013.01); *G06F 1/1681* (2013.01); *H01L 27/323* (2013.01); *H01L 27/3244* (2013.01); *H01L 51/0097* (2013.01); *E05Y 2900/606* (2013.01); *H01L 2251/5338* (2013.01)

(58) Field of Classification Search
CPC .............. H01L 51/5237; H01L 27/323; H01L 27/3244; H01L 51/0097; H01L 2251/5338; E05D 3/122; E05D 3/18; E05D 7/00; G06F 1/1652; G06F 1/1681; G06F 1/1616; G06F 1/1613; E05Y 2900/606; Y02E 10/549; G09F 9/301; F16C 11/04; H04M 1/0216
See application file for complete search history.

(56) References Cited

U.S. PATENT DOCUMENTS

| 9,204,565 | B1 * | 12/2015 | Lee ........................ E05F 1/1016 |
| 9,874,048 | B1 * | 1/2018 | Hsu ........................ G09F 9/301 |
| 9,874,906 | B1 * | 1/2018 | Hsu ........................ G06F 1/1681 |
| 10,070,546 | B1 * | 9/2018 | Hsu ........................ H05K 5/0017 |
| 10,143,098 | B1 * | 11/2018 | Lee ........................ G06F 3/0416 |

(Continued)

*Primary Examiner* — Abhishek M Rathod
(74) *Attorney, Agent, or Firm* — H.C. Park & Associates, PLC

(57) ABSTRACT

A display device includes: a display module; a first support part and a second support part disposed below the display module, the first and second support parts being arranged in a first direction; a hinge disposed between the first and second support parts below the display module to define biaxial rotation axes extending in a second direction intersecting the first direction; and a plurality of rotation parts coupled to the hinge to rotate about the biaxial rotation axes, the plurality of rotation parts being connected to the first and second support parts, respectively. Each of the rotation parts includes first and second parts that move relative to each other via a lost motion connection upon rotation of the rotation parts.

20 Claims, 29 Drawing Sheets

(56) References Cited

U.S. PATENT DOCUMENTS

| | | | |
|---|---|---|---|
| 10,231,347 B2* | 3/2019 | Seo | H05K 5/03 |
| 10,364,598 B2* | 7/2019 | Tazbaz | G06F 1/1681 |
| 10,444,789 B2* | 10/2019 | Lee | G06F 1/1616 |
| 10,585,457 B2* | 3/2020 | Park | G06F 1/1652 |
| 10,754,395 B2* | 8/2020 | Sanchez | G06F 1/1658 |
| 11,028,624 B2* | 6/2021 | Hsu | G06F 1/1641 |
| 11,061,444 B2* | 7/2021 | Nakamura | G06F 1/162 |
| 11,188,129 B2* | 11/2021 | Lin | H04M 1/022 |
| 11,224,137 B2* | 1/2022 | Hsu | E05D 11/0081 |
| 2015/0361696 A1* | 12/2015 | Tazbaz | E05D 7/00 |
| | | | 361/679.27 |
| 2017/0227994 A1* | 8/2017 | Hsu | G06F 1/1652 |
| 2017/0357295 A1* | 12/2017 | Tan | H04M 1/022 |
| 2018/0275725 A1* | 9/2018 | Lin | H04M 1/022 |
| 2018/0292860 A1* | 10/2018 | Siddiqui | H04M 1/0216 |
| 2018/0324964 A1* | 11/2018 | Yoo | G06F 1/1656 |
| 2019/0112852 A1* | 4/2019 | Hsu | E05D 11/105 |
| 2019/0179373 A1* | 6/2019 | Cheng | H04M 1/02 |
| 2020/0097051 A1* | 3/2020 | Liu | H04M 1/0216 |
| 2020/0117233 A1* | 4/2020 | Ou | E05D 7/00 |
| 2020/0117245 A1* | 4/2020 | Ou | G06F 1/1652 |
| 2020/0257335 A1* | 8/2020 | Kim | G06F 1/1618 |
| 2020/0341522 A1* | 10/2020 | Kim | G06F 1/1616 |
| 2020/0352044 A1* | 11/2020 | Hsu | G06F 1/1652 |
| 2020/0371553 A1* | 11/2020 | Hsu | G06F 1/1652 |
| 2020/0375046 A1* | 11/2020 | Sim | E05D 3/122 |
| 2021/0227709 A1* | 7/2021 | Sim | G06F 1/1652 |

* cited by examiner

DISPLAY DEVICE

CROSS REFERENCE TO RELATED APPLICATION

This application claims priority from and the benefit of Korean Patent Application No. 10-2019-0130473, filed on Oct. 21, 2019, which is hereby incorporated by reference for all purposes as if fully set forth herein.

BACKGROUND

Field

Exemplary implementations of the invention relate generally to a display device and, more specifically, to a flexible display device.

Discussion of the Background

Electronic equipment for providing an image to a user such as smartphones, digital cameras, laptop computers, navigations, and smart televisions includes a display device for displaying an image. The display device generates an image to provide the image to the user through a display screen.

In recent years, various types of display devices have been developed with the development of technology of display devices. For example, various flexible display devices that are deformed into a curved shape, folded, or rolled are being developed. Flexible display devices having shapes that are capable of being variously modified are easily carried and more convenient for the user.

Among the flexible display devices, a foldable display device includes a display module that is folded about a folding axis extending in one direction. The display module may be folded or unfolded about the folding axis.

The above information disclosed in this Background section is only for understanding of the background of the inventive concepts, and, therefore, it may contain information that does not constitute prior art.

SUMMARY

Display devices constructed according to the principles and exemplary implementations of the invention are capable of preventing a folding area from being deformed and/or reducing an edge area.

For example, the display device may include a support plate that is capable of easily supporting a display module and a buffer member disposed between a support member and the display module, such that the support member and the buffer member may be disposed below a folding area without disposing joint units and/or support bars under the folding area to prevent the folding area from being deformed.

As another example, a display device may include rotation axis units defining rotation axes of a folding area and rotation parts having a sliding structure connected to the rotation axis units, such that the rotation axis units and the rotation parts are not disposed on an edge of the display device overlapping a folding area to reduce a size of the edge of the display device.

Additional features of the inventive concepts will be set forth in the description which follows, and in part will be apparent from the description, or may be learned by practice of the inventive concepts.

According to one aspect of the invention, a display device includes: a display module; a first support part and a second support part disposed below the display module, the first and second support parts being arranged in a first direction; a hinge disposed between the first and second support parts below the display module to define biaxial rotation axes extending in a second direction intersecting the first direction; and a plurality of rotation parts coupled to the hinge to rotate about the biaxial rotation axes, the plurality of rotation parts being connected to the first and second support parts, respectively. Each of the rotation parts includes first and second parts that move relative to each other via a lost motion connection upon rotation of the rotation parts.

The first part may be coupled to the hinge to rotate about a corresponding rotation axis of the biaxial rotation axes; the second part may be connected to one of the first and second support parts, the second part being spaced apart from the first part in the first direction; and each of the rotation parts may further include a rotation unit disposed between the first and second parts to allow the first and second parts to move relative to each other in the first direction when the rotation parts rotate such that the second part moves a greater length than the first part.

Each of the rotation parts may further include: a rotation plate coupled to the hinge to rotate about the corresponding rotation axis; and a cover part disposed below the rotation plate so as to be connected to the rotation plate. The first and second parts and the rotation unit may be disposed between the rotation plate and the cover part, and a portion of the second part may be exposed to the outside of the cover part and the rotation plate so as to be connected to the one of the first and second support parts.

The first part may include a first sliding part, the second part may include a second sliding part, and each of the rotation parts may further include: a first protrusion projecting from one surface of the rotation plate facing the cover part and adjacent to the corresponding rotation axis, the first protrusion being inserted into a first sliding hole defined in the first sliding part; and a second protrusion projecting from the one surface of the rotation plate and further spaced apart from the corresponding rotation axis than the first protrusion in the first direction, the second protrusion being inserted into a second sliding hole defined in the second sliding part. The first sliding hole may have a length greater than that of the first protrusion in the first direction, and the second sliding hole may have a length greater than that of the second protrusion in the first direction.

The second sliding part may include: a first portion in which the second sliding hole is defined; and a second portion extending from the first portion to the corresponding rotation axis in the first direction, the second portion facing the first sliding part in the second direction. The rotation unit may be disposed between the first sliding part and the second portion so as to be connected to the first sliding part and the second portion, and when the rotation parts rotate, the rotation unit may allow the first sliding part and the first portion to move relative to each other in the first direction.

Each of the rotation parts may further include a third protrusion projecting from the one surface of the rotation plate, the third protrusion being inserted into a third sliding hole defined in the second portion, and the third sliding hole may have a length greater than that of the third protrusion in the first direction.

Each of the rotation parts may further include a fourth protrusion projecting from the one surface of the rotation plate so as to be disposed between the first sliding part and the second portion, the fourth protrusion being inserted into a rotation hole defined in the rotation unit.

The rotation unit may include: a first teeth part defined on one side of the rotation unit facing the first sliding part and disposed to be engaged with a second teeth part defined on a portion of the first sliding part; and a third teeth part defined on the other side of the rotation unit facing the second portion and disposed to be engaged with a fourth teeth part defined on the second portion.

The second teeth part and the fourth teeth part may extend in the first direction, and the fourth teeth part may have a length greater than that of the second teeth part in the first direction.

Teeth of the first teeth part may be arranged along a first curve having a first curvature, and teeth of the third teeth part may be arranged along a second curve having a second curvature, and the first curvature may be greater than the second curvature, and the first curve may have a length less than that of the second curve.

The hinge may include: a central part extending in the second direction; a rotation axis unit disposed below the central part to define the biaxial rotation axes; a first hinge part disposed between the first support part and the central part so as to be connected to the first support part; and a second hinge part disposed between the second support part and the central part so as to be connected to the second support part. The rotation parts may be disposed below the first and second hinge parts and coupled to the rotation axis unit to rotate about the biaxial rotation axes.

The hinge may further include a coupling part disposed on the central part and extending in the first direction. The rotation plates of the rotation parts may be coupled to the rotation axis unit to rotate about the biaxial rotation axes, and the rotation plates may be rotatably coupled to both sides of the coupling part, which face opposite to each other in the first direction.

The first sliding parts of the rotation parts may be rotatably coupled to lower portions of both of the sides of the coupling part to rotate about the biaxial rotation axes.

The first sliding parts may include fifth teeth parts defined on upper portions of the first sliding parts and disposed to be engaged with sixth teeth parts defined on the lower portions of both the sides of the coupling part, respectively, and each of the sixth teeth parts may be disposed along a virtual curve using each of the biaxial rotation axes as a central point.

The portion of the second sliding part, which is exposed to the outside of the cover part and the rotation plate, is a connected to corresponding one of the first and second hinge parts.

The hinge may further include: a third hinge part disposed between the central part and the first hinge part; and a fourth hinge part disposed between the central part and the second hinge part. The third and fourth hinge parts may be disposed on the rotation plates of the rotation parts and connected to the rotation plates.

The first hinge part may include: a first extension part extending in the second direction and connected to the first support part; and a first sub support plate extending from the first extension part to the third hinge part and disposed below the third hinge part. The second hinge part may include: a second extension part extending in the second direction and connected to the second support part; and a second sub support plate extending from the second extension part to the fourth hinge part and disposed below the third hinge part.

The display device may further include: a support member disposed between the first and second support parts and the display module and between the hinge and the display module, and when viewed in a plane, the support member having a plurality of openings overlapping the biaxial rotation axes; and a buffer member disposed between the display module and the support member. The support member may be attached to the central part, the first and second hinge parts, and the first and second support parts.

The display device may further include first edge parts connected to both sides of the central part, which face opposite to each other in the second direction, the first edge parts having flexibility. The first edge parts may have a plurality of grooves in lower portions of the first edge parts overlapping the biaxial rotation axes.

According to another aspect of the invention, a display device includes: a display module; a first support part and a second support part disposed below the display module, the first and second support parts being arranged in a first direction; a hinge disposed between the first and second support parts below the display module to define biaxial rotation axes extending in a second direction intersecting the first direction; and a plurality of rotation parts coupled to the hinge to rotate about the biaxial rotation axes, the plurality of rotation parts being connected to the first and second support parts, respectively. Each of the rotation parts includes: a first part coupled to the hinge to rotate about a corresponding rotation axis of the biaxial rotation axes; and a second part connected to one of the first and second support parts, the second part being spaced apart from the first part in the first direction. When the rotation parts rotate, the first and second parts move relative to each other in the first direction such that the second part moves a greater length than the first part.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
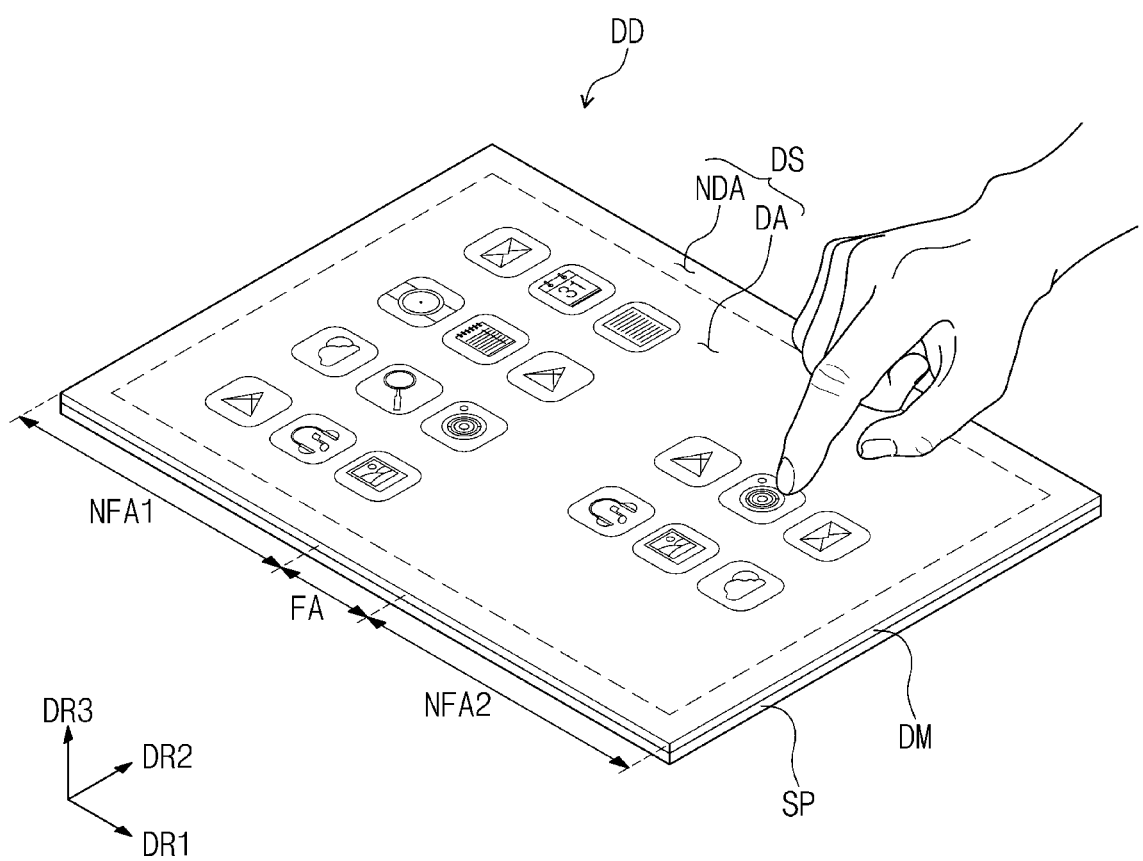
FIG. 1 is a perspective view of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the"

are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
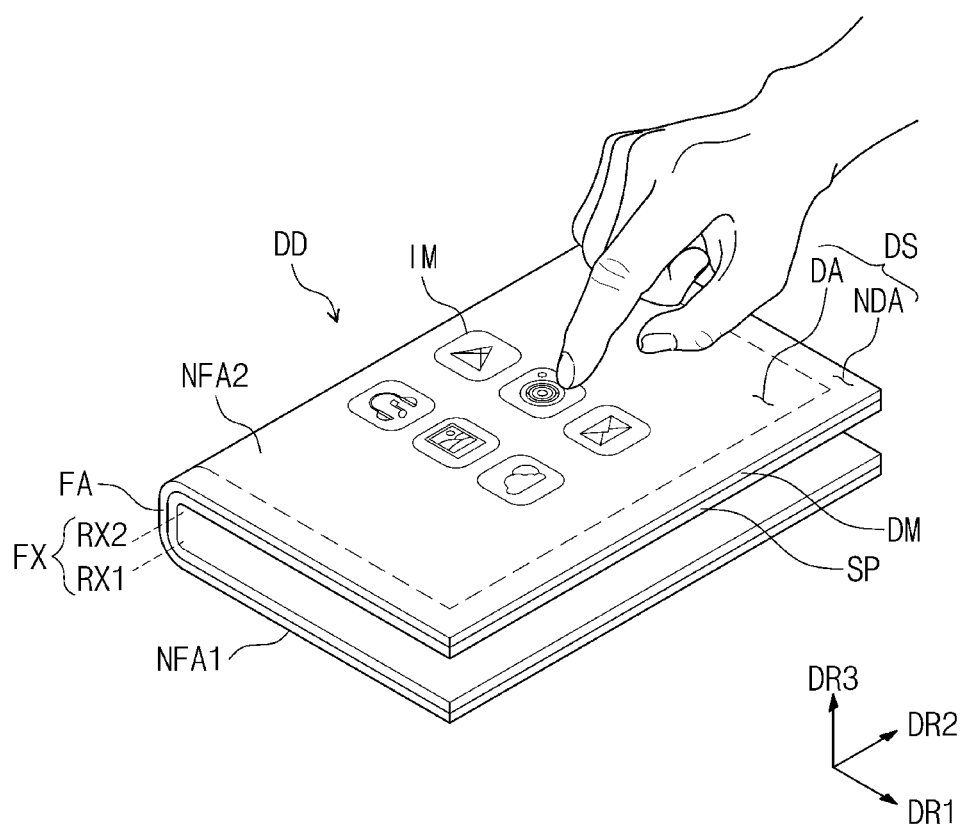
FIG. 2 is a perspective view of the display device of FIG. 1 in a folded position.

FIG. 1 is a perspective view of a display device constructed according to the principles of the invention. FIG. 2 is a perspective view of the display device of FIG. 1 in a folded position.

Referring to FIGS. 1 and 2, a display device DD has a substantially rectangular shape with long sides in a first direction DR1 and short sides in a second direction DR2 intersecting the first direction DR1. However, exemplary embodiments are not limited thereto. For example, the display device DD may have various shapes. The display device DD may be a flexible display device, i.e., a folding-type (foldable) display device that is folded or unfolded about a folding axis FX extending in the second direction DR2.

The folding axis FX may provide biaxial rotation axes RX1 and RX2 extending substantially in parallel to each other in the second direction DR2 to the display device DD. The biaxial rotation axes RX1 and RX2 may include a first rotation axis RX1 and a second rotation axis RX2, which extend in the second direction DR2 and are spaced apart from each other in the first direction DR1. The display device DD may be folded about one or both of the first and second rotation axes RX1 and RX2.

The display device DD may include a display module DM and a support part in the form of a bracket SP disposed below the display module DM. The display module DM may be a flexible display module. A top surface of the display module DM may be defined as a display surface DS and have a plane defined by the first direction DR1 and the second direction DR2. Images IM generated from the display module DM may be provided to a user through the display surface DS.

The display surface DS may include a display area DA on which an image is displayed and a non-display area NDA around the display area DA. The non-display area NDA may surround the display area DA and provide an edge portion of the display device DD, which is printed with a predetermined color.

The display module DM may include a folding area FA and a plurality of non-folding areas NFA1 and NFA2. The non-folding areas NFA1 and NFA2 may include a first non-folding area NFA1 and a second non-folding area NFA2. The folding area FA may be disposed between the first non-folding area NFA1 and the second non-folding area NFA2. The folding area FA and the first and second non-folding areas NFA1 and NFA2 may be arranged in the first direction DR1. The folding area FA may overlap the first and second rotation axes RX1 and RX2.

For example, although one folding area FA and two first and second non-folding areas NFA1 and NFA2 are provided, exemplary embodiments are not limited thereto. For example, the number of folding area FA and the number of non-folding areas NFA1 and NFA2 are not limited thereto. For example, the display module DM may include a plurality of non-folding areas that are more than two and a plurality of folding areas disposed between the non-folding areas.

The bracket SP may support the display module DM and be folded by rotation about the first and second rotation axes RX1 and RX2. As the bracket SP is folded, the display module DM may be folded by the bracket SP. The folding area FA may be bent so that the display module DM is folded.

The bracket SP may outwardly fold (out-fold) the display device DD so that the display surface DS of the display module DM is exposed to the outside when the display device DD is folded. More detailed configuration of the bracket SP will be described below in detail.

Figure 3:
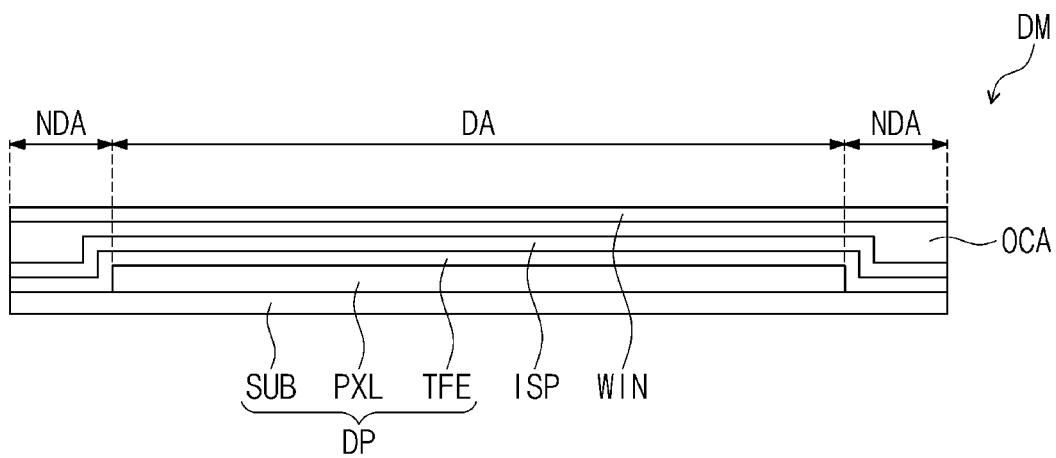
FIG. 3 is a schematic cross-sectional view of an exemplary embodiment of the display module of FIG. 1.

FIG. 3 is a schematic cross-sectional view of an exemplary embodiment of the display module of FIG. 1.

Referring to FIG. 3, the display module DM may include a display panel DP, an input sensing part ISP disposed on the display panel DP, a window WIN disposed on the input sensing part ISP, and an adhesive OCA disposed between the input sensing part ISP and the window WIN.

The display panel DP may be an emission type display panel, but is not limited thereto. For example, the display panel DP may be an organic light emitting display panel, a quantum dot light emitting display panel or other known display panels. The organic light emitting display panel may include an organic light emitting material. A light emitting layer of the quantum dot light emitting display panel may include a quantum dot, a quantum rod, and the like. Hereinafter, the display panel DP may be described as the organic light emitting display panel for descriptive convenience.

The display panel DP may be a flexible display panel. The display panel DP may include a substrate SUB, a pixel layer PXL disposed on the substrate SUB, and a thin film encapsulation layer TFE disposed on the substrate SUB to cover the pixel layer PXL. The substrate SUB may be a transparent substrate and include a flexible plastic substrate. For example, the substrate SUB may include polyimide (PI).

The substrate SUB may include a display area DA and a non-display area NDA around the display area DA, like the display surface DS. The pixel layer PXL may be disposed on the display area DA. The pixel layer PXL may include a plurality of pixels, and each of the pixels may include a light emitting element.

The thin film encapsulation layer TEF may include at least two inorganic layers and an organic layer disposed between the at least two inorganic layers. The inorganic layers may include an inorganic material and protect the pixel layer PXL against moisture/oxygen. The organic layer may include an organic material and protect the pixel layer PXL against foreign substances such as dust particles.

The input sensing part ISP may be disposed on the thin film encapsulation layer TFE. The input sensing part ISP may sense an external input (user's hand, touch pen, or the like) to change the external input into a predetermined input signal. The input sensing part ISP may include a plurality of sensing electrodes that sense the external input. The sensing electrodes may sense the external input in a capacitive manner.

The input sensing part ISP may be directly manufactured on the thin film encapsulation layer TFE when the display module DM is manufactured. However, exemplary embodiments are not limited thereto. For example, the input sensing part ISP may be manufactured as a touch panel that is separated from the display panel DP and then attached to the display panel DP by using an adhesive.

The window WIN may protect the display panel DP and the input sensing part ISP against external scratch and impact. The window WIN may be attached to the input sensing part ISP by using the adhesive OCA. The adhesive OCA may include an optical clear adhesive. An image generated in the display panel DP may pass through the window WIN and then be provided to the user.

Figure 4:
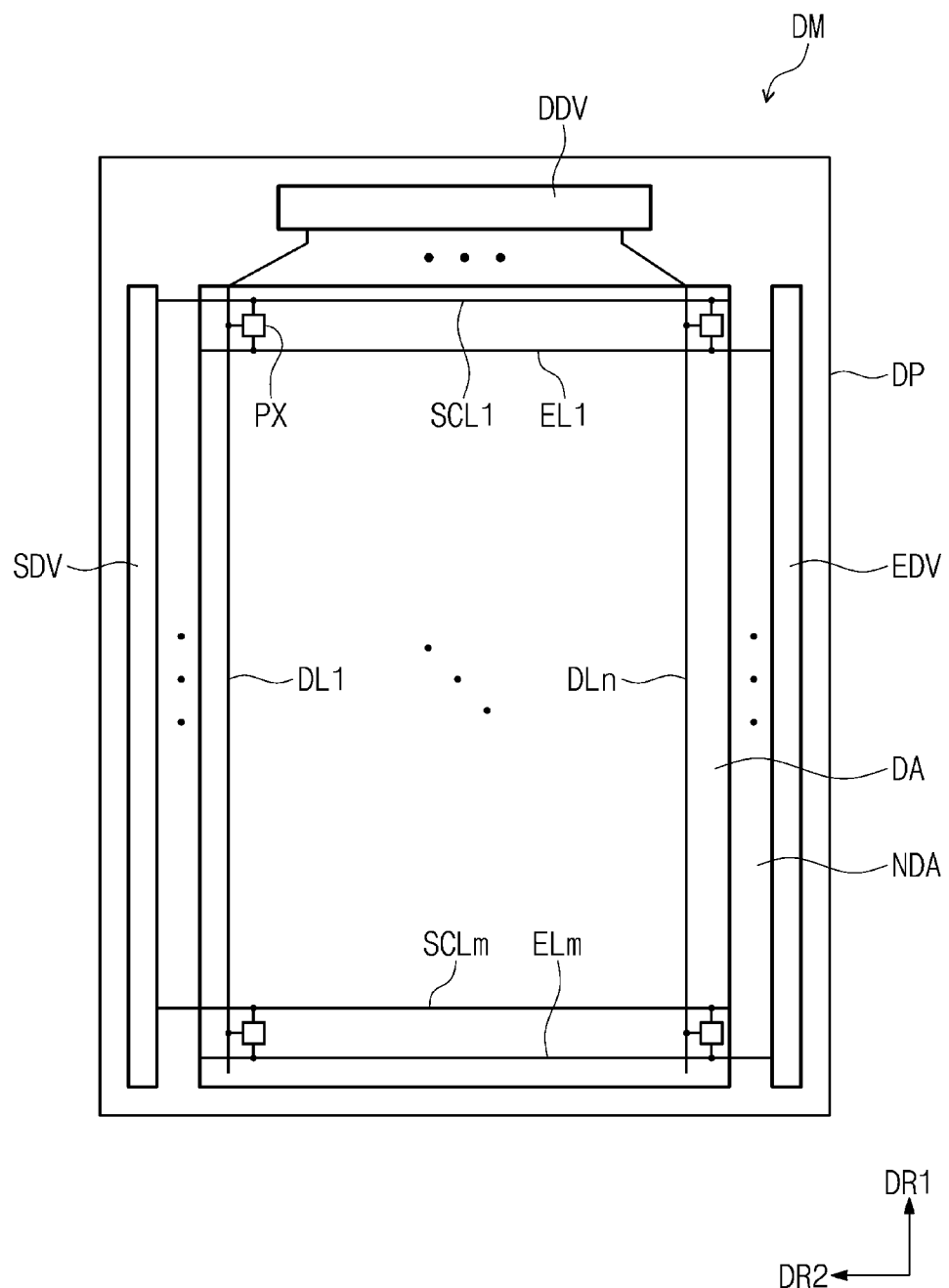
FIG. 4 is a block diagram of an exemplary embodiment of the display module of FIG. 3.

FIG. 4 is a block diagram of an exemplary embodiment of the display module of FIG. 3.

Referring to FIG. 4, the display module DM may include a display panel DP, a scan driver SDV, a data driver DDV, and an emission driver EDV. A planar shape of the display panel DP is exemplified in FIG. 4 without the input sensing part ISP of FIG. 3 for descriptive convenience.

The display panel DP may have a substantially rectangular shape having long sides in the first direction DR1 and short sides in the second direction DR2. The display panel DP may include a display area DA and a non-display area NDA surrounding the display area DA, like the display surface DS.

The display panel DP may include a plurality of pixels PX, a plurality of scan lines SCL1 to SCLm, a plurality of data lines DL1 to DLn, and a plurality of emission lines EL1 to ELm. Here, m and n are natural numbers. The pixels PX may be disposed on the display area DA and connected to the scan lines SCL1 to SCLm, the data lines DL1 to DLn, and the emission lines EL1 to ELm.

The scan driver SDV, the data driver DDV, and the emission driver EDV may be disposed on the non-display area NDA. The scan driver SDV and the data driver DDV may be disposed on the non-display areas that are adjacent to long sides of the display panel DP, respectively. The data driver DDV may be manufactured in the form of an integrated circuit chip and disposed on the non-display area NDA that is adjacent to any one short side of the short sides of the display panel DP.

The scan lines SCL1 to SCLm may extend in the second direction DR2 and be connected to the scan driver SDV. The data lines DL1 to DLn may extend in the first direction DR1 and be connected to the data driver DDV. The emission lines EL1 to ELm may extend in the second direction DR2 and be connected to a gate driver EDV.

The scan driver SDV may generate a plurality of scan signals, and the scan signals may be applied to the pixels PX through the scan lines SCL1 to SCLm. The scan signals may be sequentially applied to the pixel PX. The data driver DDV may generate a plurality of data voltages, and the data voltages may be applied to the pixels PX through the data lines DL1 to DLn. The emission driver EDV may generate a plurality of emission signals, and the emission signals may be applied to the pixels PX through the emission lines EL1 to ELm.

The display module DM may include a timing controller that controls operations of the scan driver SDV, the data driver DDV, and the emission driver EDV.

The pixels PX may receive the data voltages in response to the scan signals. The pixels PX may emit light having luminance corresponding the data voltages in response to the emission signals to display an image. An emission time of the pixels PX may be controlled by the emission signals.

Figure 5:
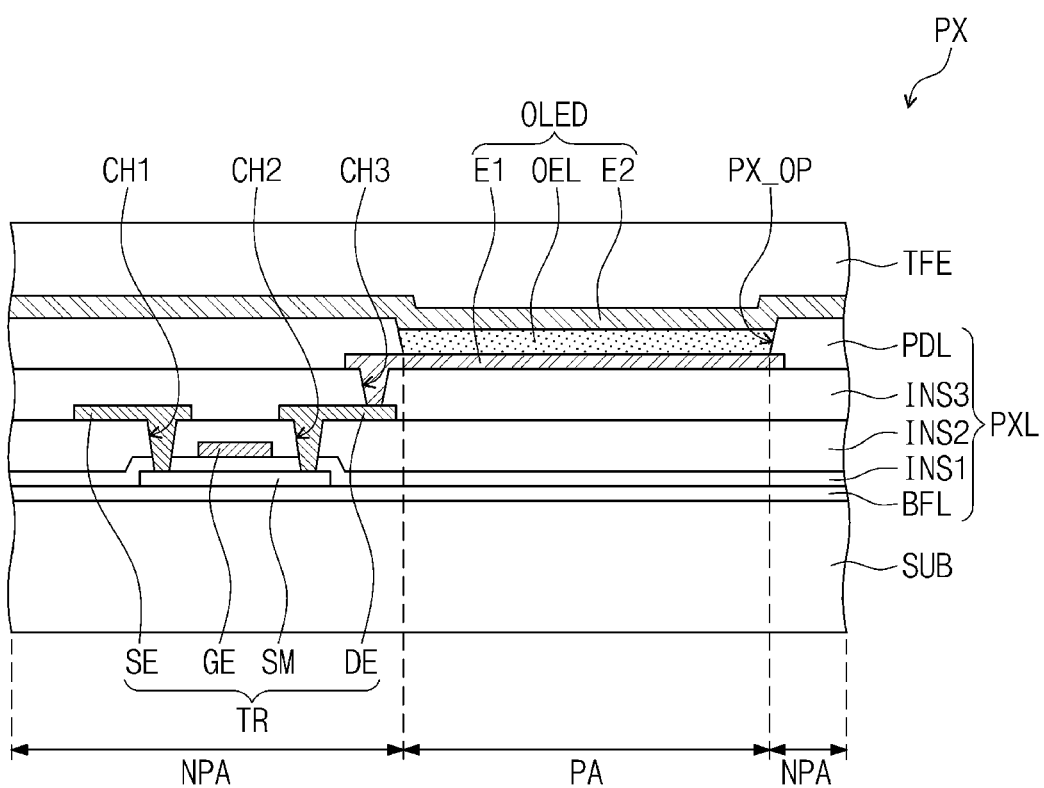
FIG. 5 is a schematic cross-sectional view of an exemplary embodiment of a representative pixel of FIG. 4.

FIG. 5 is a schematic cross-sectional view of an exemplary embodiment of a representative pixel of FIG. 4.

Each of other pixels PX may have the same configuration as the pixel of FIG. 5.

Referring to FIG. 5, the pixel PX may include the light emitting element OLED and the transistor TR connected to the light emitting element OLED. The light emitting element OLED may include a first electrode E1, a second electrode E2, and an organic emission layer OEL disposed between the first electrode E1 and the second electrode E2.

The first electrode E1 may be an anode electrode, and the second electrode E2 may be a cathode electrode. The first electrode E1 may be defined as a pixel electrode, and the second electrode E2 may be defined as a common electrode.

The pixel PX may be divided into a pixel area PA and a non-pixel area NPA around the pixel area PA. The light emitting element OLED may be disposed on the pixel area PA, and the transistor TR may be disposed on the non-pixel area NPA.

The transistor TR and the light emitting element OLED may be disposed on the substrate SUB. A buffer layer BFL may be disposed on the substrate SUB, and the buffer layer may include an inorganic material.

The semiconductor layer SM of the transistor TR may be disposed on the buffer layer BFL. The semiconductor layer SM may include a semiconductor or an organic semiconductor that is made of an inorganic material such as amorphous silicon or polycrystalline silicon. Also, the semiconductor layer SM may include an oxide semiconductor. The semiconductor layer SM may include a source region, a drain region, and a channel region between the source region and the drain region.

A first insulation layer INS1 may be disposed on the buffer layer BFL to cover the semiconductor layer SM. The first insulation layer INS1 may include an inorganic material. A gate electrode GE of the transistor TR overlapping the semiconductor layer SM may be disposed on the first insulation layer INS1. The gate electrode GE may be disposed to overlap the channel region of the semiconductor layer SM.

A second insulation layer INS2 may be disposed on the first insulation layer INS1 to cover the gate electrode GE. The second insulation layer INS2 may be defined as an interlayer dielectric. The second insulation layer INS2 may include an organic material and/or an inorganic material.

The source electrode SE and the drain electrode DE of the transistor TR may be disposed to be spaced apart from each other on the second insulation layer INS2. The source electrode SE may be connected to the source region of the semiconductor layer SM through a first contact hole CH1 that is defined to pass through the first and second insulation layers INS1 and INS2. The drain electrode DE may be connected to the drain region of the semiconductor layer SM through a second contact hole CH2 that is defined to pass through the first and second insulation layers INS1 and INS2.

A third insulation layer INS3 may be disposed on the second insulation layer INS2 to cover the source and drain electrodes SE and DE of the transistor TR. The third insulation layer INS3 may be defined as a planarization layer that provides a flat top surface and include an organic material.

The first electrode E1 may be disposed on the third insulation layer INS3. The first electrode E1 may be connected to the drain electrode DE of the transistor TR through a third contact hole H3 that is defined to pass through the third insulation layer INS3.

A pixel define layer PDL through which a predetermined area of the first electrode E1 is exposed may be disposed on the first electrode E1 and the third insulation layer INS3. An opening PX_OP through which a predetermined portion of the first electrode E1 is exposed may be defined in the pixel define layer PDL.

An organic emission layer OEL may be disposed on the first electrode E1 within the opening PX_OP. The organic emission layer OEL may emit one of red light, green light, and blue light. However, exemplary embodiments are not limited thereto. For example, the organic emission layer may generate white light by the combination of organic materials that respectively generate red, green, and blue light.

A second electrode E2 may be disposed on the pixel define layer PDL and the organic light emitting layer OEL. The thin film encapsulation layer TFE may be disposed on the light emitting element OLED to cover the pixel PX. A layer between the substrate SUB and the thin film encapsulation layer TFE may be defined as the pixel layer PXL.

The first voltage ELVDD may be applied to the first electrode E1, and the second voltage ELVSS may be applied to the second electrode E2. Holes and electrons injected into the organic emission layer OEL may be coupled to each other to form exciton. While the exciton may be transitioned to a ground state, the organic light emitting element OLED may emit light. The light emitting element OLED may emit red, green, or blue light according to a flow of current to display an image.

Figure 6:
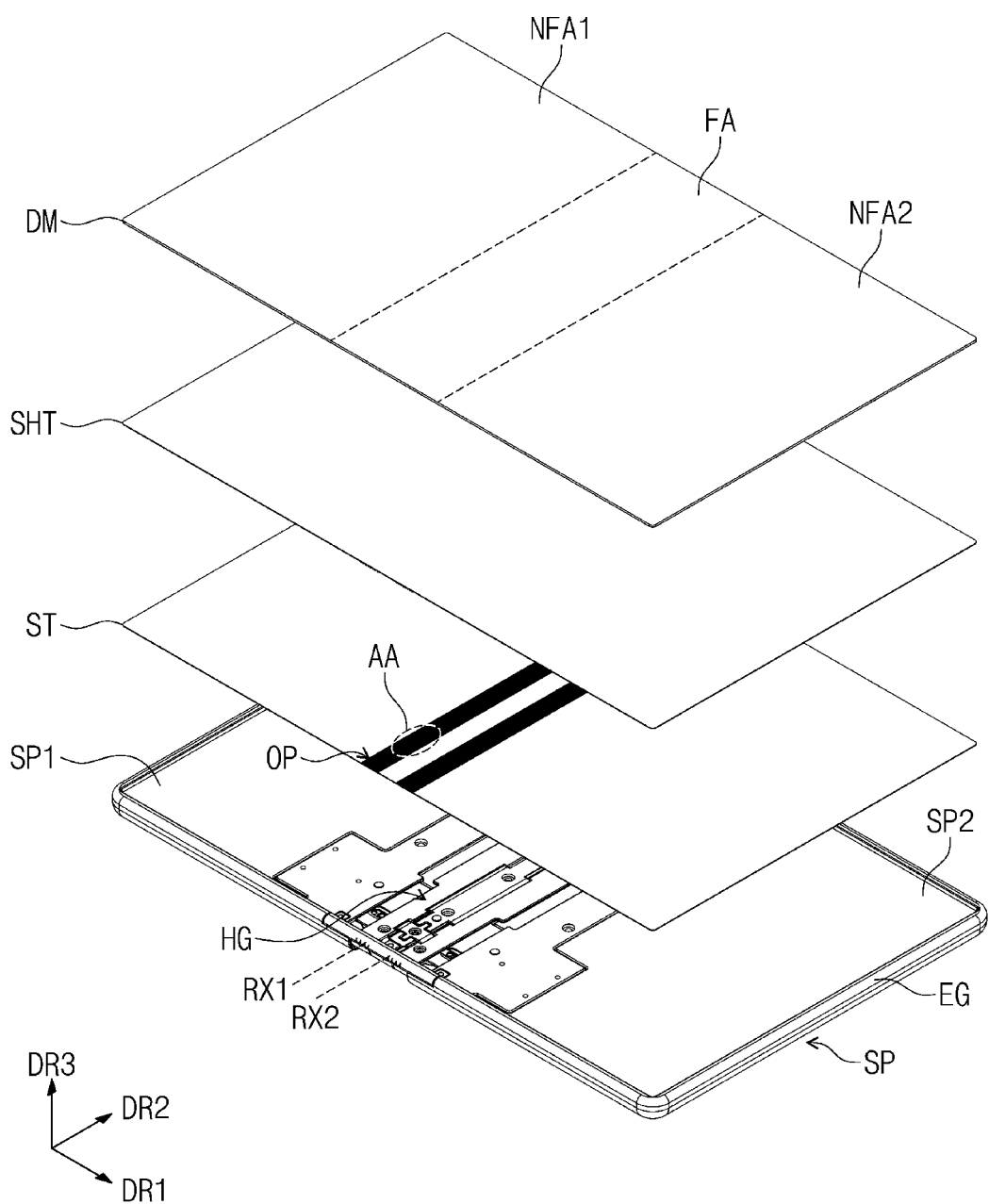
FIG. 6 is an exploded perspective view of an exemplary embodiment of the display device of FIG. 1 constructed according to the principles of the invention.
Figure 7:
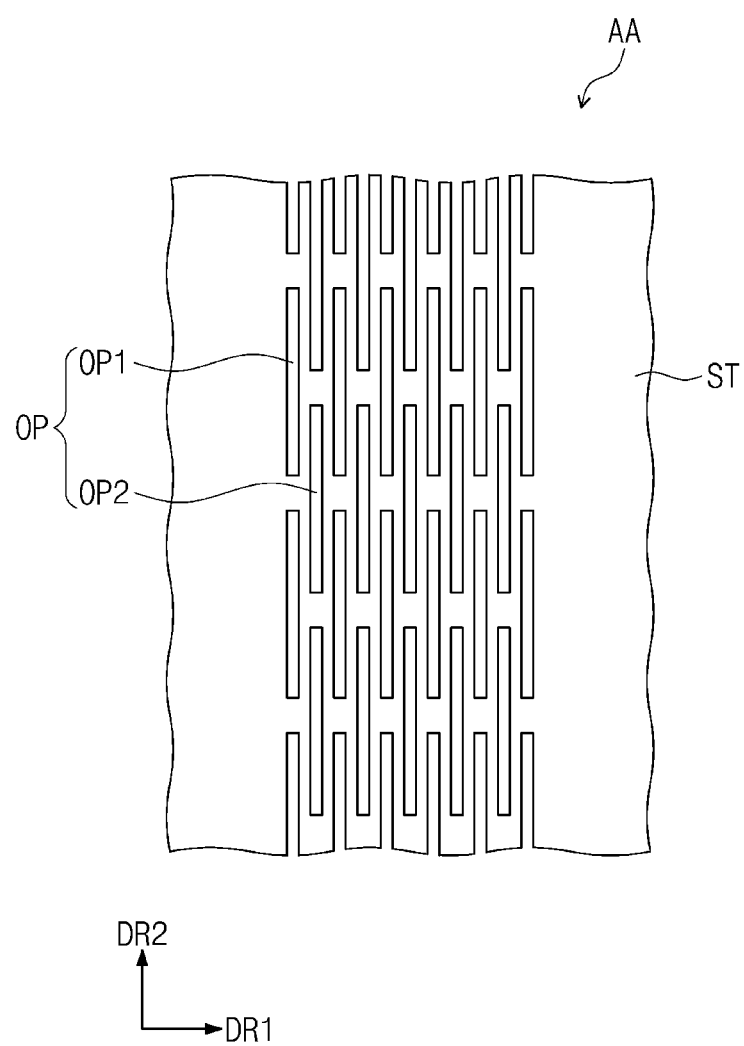
FIG. 7 is an enlarged view of area AA of FIG. 6.

FIG. 6 is an exploded perspective view of an exemplary embodiment of the display device of FIG. 1 constructed according to the principles of the invention. FIG. 7 is an enlarged view of area AA of FIG. 6.

Referring to FIG. 6, the display device DD may include a display module DM, a bracket SP, a buffer member in the form of a sheet part SHT, and a support member in the form a support plate ST. The bracket SP may be disposed under the display module DM, and the support plate ST may be disposed between the bracket SP and the display module DM. The sheet part SHT may be disposed between the display module DM and the support plate ST.

The display module DM includes a first non-folding area NFA1, a second non-folding area NFA2, and a folding area FA disposed between the first non-folding area NFA1 and the second non-folding area NFA2.

The bracket SP may include a first bracket SP1, a second bracket SP2, and a hinge HG disposed between the first bracket SP1 and the second bracket SP2. The first bracket SP1, the second bracket SP2, and the hinge HG may be disposed in the first direction DR1. The first and second brackets SP1 and SP2 may have a plane defined by the first and second directions DR1 and DR2. The hinge HG may define first and second rotation axes RX1 and RX2 which are biaxial rotation axes.

The first bracket SP1 may be disposed below the first non-folding area NFA1. The second bracket SP2 may be disposed below the second non-folding area NFA2. The hinge HG may be disposed below the folding area FA. The first bracket SP1 and the second bracket SP2 may be connected to both sides of the hinge HG, which are opposite to each other in the first direction DR1.

The bracket SP may include an edge part EG defining an edge of the bracket SP. The first bracket SP1, the second bracket SP2, and the hinge HG may be disposed beneath the top surface of the edge part EG. The display module DM, the sheet part SHT, and the support plate ST may be disposed on the first bracket SP1, the second bracket SP2, and the hinge HG. The edge part EG may surround edges of the display module DM, the sheet part SHT, and the support plate ST, which are disposed on the first bracket SP1, the second bracket SP2, and the hinge HG.

The sheet part SHT may include a flexible material to provide a damping function. For example, the sheet part SHT may include rubber. The support plate ST may include a metal material.

Referring to FIGS. 6 and 7, a plurality of openings OP may be defined in the support plate ST. When viewed in a plane, the openings OP may overlap a portion of the folding area FA and a portion of the hinge HG. The openings OP may overlap the first rotation axis RX1 and the second rotation axis RX2 to facilitate rotation by removal of material. Of course other types of discontinuities in the support plate may be provide to facilitate bending of the support plate about the rotation axes other than openings.

The openings OP may be defined by removing portions of the support plate ST. The opening OP may extend in the second direction DR2. The openings OP may be arranged in the first direction DR1 and the second direction DR2.

The openings OP may include a plurality of first openings OP1 arranged in the first direction DR1 and the second direction DR2 and a plurality of second openings OP2 arranged in the first direction DR1 and the second direction DR2. The second openings OP2 may be disposed between the first opening OP1 in the first direction DR1. The second openings OP2 and the first openings OP1 may be disposed to miss each other.

Figure 8:
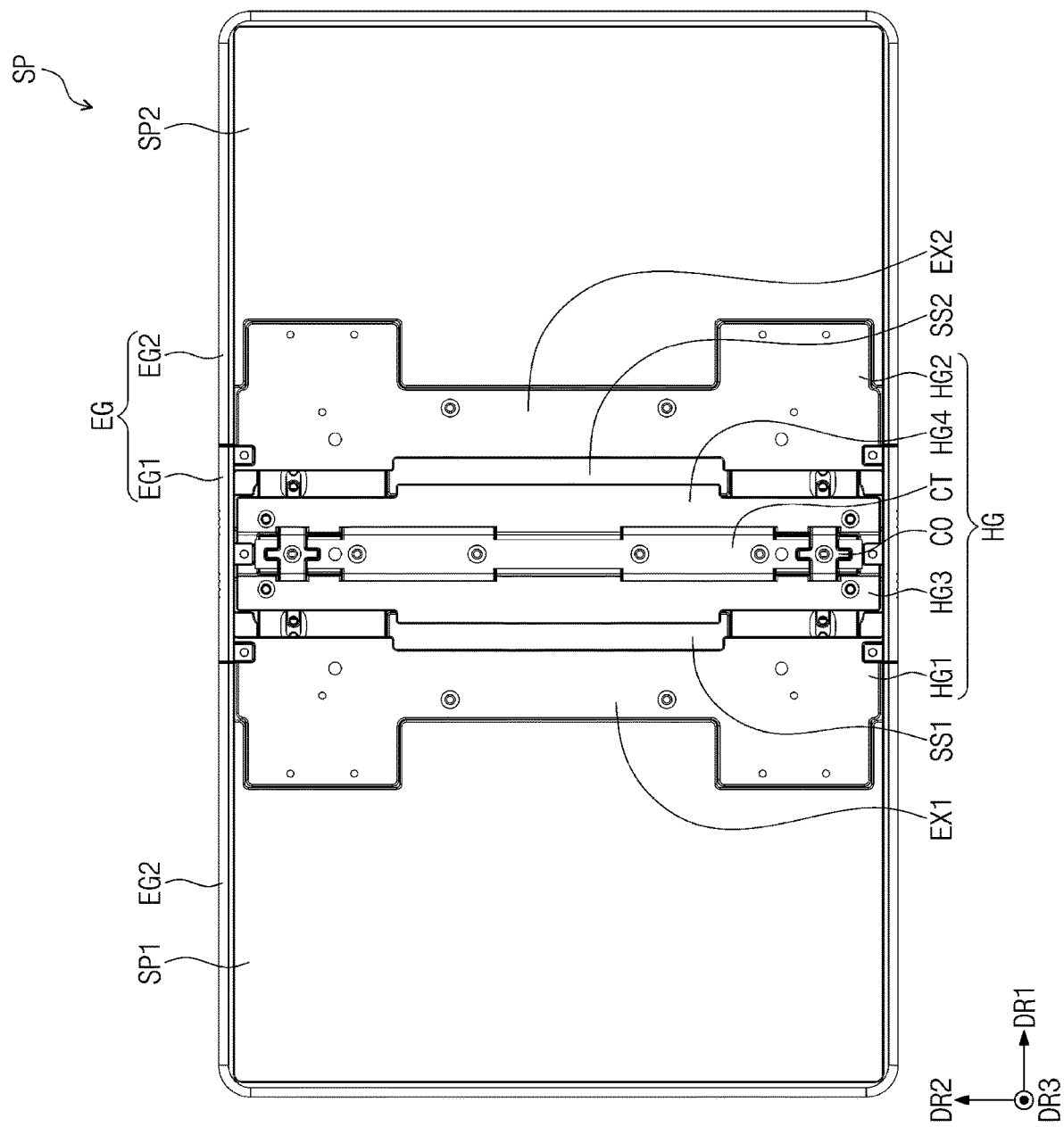
FIG. 8 is a plan view of the bracket of FIG. 6.
Figure 9:
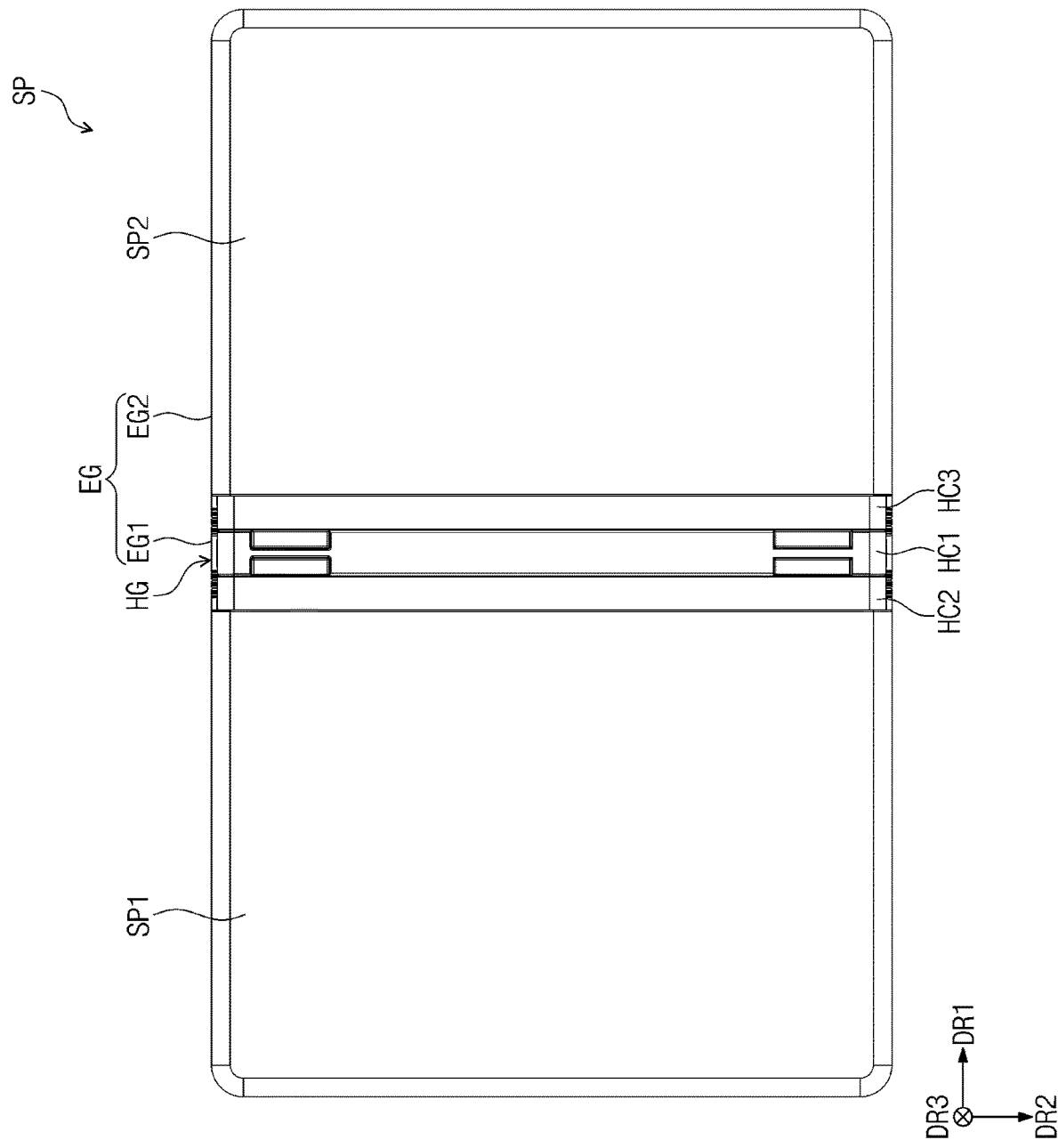
FIG. 9 is a bottom, plan view of the bracket of FIG. 6.
Figure 10:
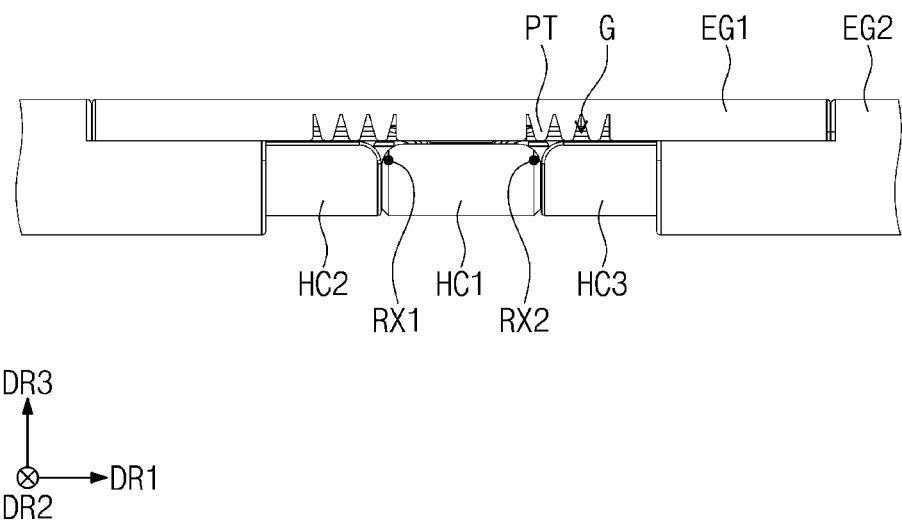
FIG. 10 is a side view of the first edge part of FIG. 8.

FIG. 8 is a plan view of the bracket of FIG. 6. FIG. 9 is a bottom, plan view of the bracket of FIG. 6. FIG. 10 is a side view of the first edge part of FIG. 8.

In the following description of a lower part of the bracket of FIGS. 9 and 12, a lower portion, a rear surface, and a bottom of each component may mean an opposite surface of a front surface, an opposite portion of an upper portion, and an opposite portion of a top (upper) portion of each component of FIGS. 8 and 11.

Referring to FIG. 8, the hinge HG includes a central part CT, a plurality of coupling parts CO, a first hinge part HG1, a second hinge part HG2, a third hinge part HG3, and a fourth hinge part HG4. The central part CT may be disposed at a center portion of the hinge HG to extend in the second direction DR2.

The coupling parts CO may be disposed on the central part CT and connected to the central part CT. The coupling parts CO may be adjacent to both sides of the central part CT, which are opposite to each other in the second direction DR2. The coupling parts CO may extend in the first direction DR1. For example, the coupling parts CO may have a cross shape extending longer in the first direction DR1. However, the number and shape of the coupling parts CO are not limited thereto.

Each of the first hinge part HG1 and the second hinge part HG2 may extend in the second direction DR2. The first hinge part HG1 may be disposed between the first bracket SP1 and the central part CT and connected to the first bracket SP1. The second hinge part HG2 may be disposed between the second bracket SP2 and the central part CT and connected to the second bracket SP2.

The third hinge part HG3 may be disposed between the central part CT and the first hinge part HG1. The fourth hinge part HG4 may be disposed between the central part CT and the second hinge part HG2. The central part CT may be disposed between the third hinge part HG3 and the fourth hinge part HG4. The third hinge part HG3 and the fourth hinge part HG4 may extend in the second direction DR2.

A portion of the first hinge part HG1 adjacent to the third hinge part HG3 may be disposed below the third hinge part HG3. A portion of the second hinge part HG2 adjacent to the fourth hinge part HG4 may be disposed below the fourth hinge part HG4.

For example, the first hinge part HG1 may include a first extension part EX1 extending in the second direction DR2 and a first sub support plate SS1 extending from the first extension part EX1 to the third hinge part HG3. One side of the first extension part EX1 and one side of the third hinge part HG3 may face each other. The first sub support plate SS1 may be disposed below and overlap the third hinge part HG3.

The second hinge part HG2 may include a second extension part EX2 extending in the second direction DR2 and a second sub support plate SS2 extending from the second extension part EX2 to the fourth hinge part HG4. One side of the second extension part EX2 and one side of the fourth hinge part HG4 may face each other. The second sub support plate SS2 may be disposed below and overlap the fourth hinge part HG4.

When the display device DD is in an unfolded position, a portion of the first sub support plate SS1 may be disposed under the third hinge part HG3, and a portion of the second sub support plate SS2 may be disposed below the fourth hinge part HG4. Also, one side of the first extension part EX1 and one side of the third hinge part HG3 may be spaced apart from each other in the first direction DR1, and one side of the second extension part EX2 and one side of the fourth hinge part HG4 may be spaced apart from each other in the first direction DR1.

When the display device DD is folded, the first and second hinge parts HG1 and HG2 may move toward the third and fourth hinge parts HG3 and HG4, respectively. When the display device DD is folded, one side of the first extension part EX1 and one side of the third hinge part HG3 may be adjacent to each other, and the first sub support plate SS1 may move below the third hinge part HG3. One side of the second extension part EX2 and one side of the fourth hinge part HG4 may be adjacent to each other, and the second sub support plate SS2 may move below the fourth hinge part HG4. An operation of this hinge HG will be described in detail below.

The edge part EG may include a plurality of first edge parts EG1 and a plurality of second edge parts EG2. The first edge parts EG1 may be disposed at both sides of the hinge HG, which are opposite to each other in the second direction DR2. The first edge parts EG1 may be connected to both sides of the central part CT, which are opposite to each other in the second direction DR2, both sides of the first hinge part HG1, which are opposite to each other in the second direction DR2, and both sides of the second hinge part HG2, which are opposite to each other in the second direction DR2.

The second edge parts EG2 may be disposed on both sides of the first bracket SP1, which are opposite to each other in the second direction DR2, and both sides of the second bracket SP2, which are opposite to each other in the second direction DR2. Also, the second edge parts EG2 may be disposed on an opposite side of one side of the first bracket SP1 facing the first hinge part HG1 and an opposite side of one side of the second bracket SP2 facing the second hinge part HG2.

Referring to FIG. 9, the bracket SP may include a first hinge cover part HC1, a second hinge cover part HC2, and a third hinge cover part HC3, which cover a lower portion of the hinge HG. The first, second, and third hinge cover parts HC1, HC2, and HC3 may be disposed between the first bracket SP1 and the second bracket SP2. The first hinge cover part HC1 may be disposed between the second hinge cover part HC2 and the third hinge cover part HC3.

The first hinge cover part HC1 may cover a lower portion of the central part CT. The second hinge cover part HC2 may cover a lower portion of the third hinge part HG3. The third hinge cover part HC3 may cover a lower portion of the fourth hinge part HG4.

Referring to FIG. 10, when viewed in the second direction DR2, the first, second, and third hinge cover parts HC1, HC2, and HC3 may be disposed below the first edge part EG1. The first edge part EG1 may have flexibility. For example, the first edge part EG1 may include rubber. Therefore, the first edge part EG1 may be easily bent.

A plurality of grooves G may be defined in a lower portion of the first edge part EG1. When viewed in the plan view, the grooves G may overlap the first and second rotation axes RX1 and RX2. The first edge part EG1 may include a plurality of protrusions PT disposed between the grooves G. Each of the protrusions PT may have an inverted trapezoidal shape.

Figure 11:
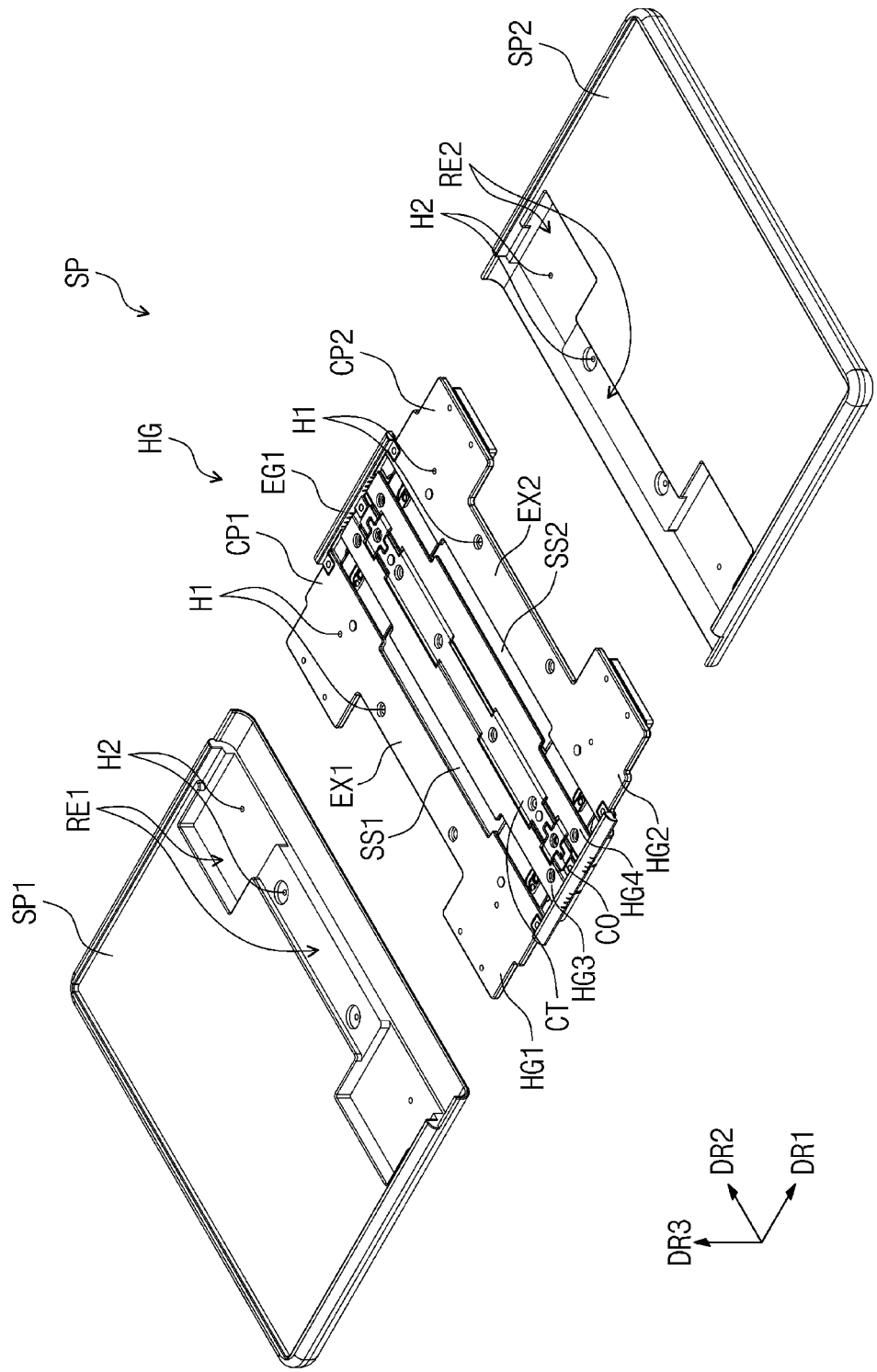
FIG. 11 is an exploded perspective view illustrating a front surface of the bracket of FIG. 8.

FIG. 11 is an exploded perspective view illustrating a front surface of the bracket of FIG. 8. FIG. 12 is an exploded perspective view illustrating a rear surface of the bracket of FIG. 9.

Referring to FIG. 11, a first recess part RE1 may be defined in a predetermined portion of the first bracket SP1 adjacent to bracket SP on one side of the first bracket SP1 facing the hinge HG. A second recess part RE2 may be defined in a predetermined portion of the second bracket SP2 adjacent to bracket SP on one side of the second bracket SP2 facing the hinge HG. The one side of the first bracket SP1 and the one side of the second bracket SP2 may face each other with the hinge HG therebetween.

The first hinge part HG1 may include a plurality of first connection plates CP1 extending from both sides of the first extension part EX1, which are opposite to each other in the second direction DR2, to the first bracket SP1. The second hinge part HG2 may include a plurality of second connection plates CP2 extending from both sides of the second extension part EX2, which are opposite to each other in the second direction DR2, to the second bracket SP2.

The first recess part RE1 may have a shape corresponding to the first extension part EX1 and the first connection plates CP1. The second recess part RE2 may have a shape corresponding to the second extension part EX2 and the second connection plates CP2.

The first extension part EX1 and the first connection plates CP1 may be disposed in the first recess part RE1 and connected to the first bracket SP1. The second extension part EX2 and the second connection plates CP2 may be disposed in the second recess part RE2 and connected to the second bracket SP2.

For example, a plurality of first holes H1 may be defined in the first extension part EX1, the first connection plates CP1, the second extension part EX2, and the second connection plates CP2. A plurality of second holes H2 may be defined in a portion of the first bracket SP1, in which the first recess part RE1 is defined, and a portion of the second bracket SP2, in which the second recess part RE2 is defined.

Connection pins may be inserted into the first holes H1 and the second holes H2 so that the first extension part EX1 and the first connection plates CP1 are connected to the first bracket SP1, and the second extension part EX2 and the second connection plates CP2 are connected to the second bracket SP2. As a result, the first hinge part HG1 and the second hinge part HG2 may be connected to the first bracket SP1 and the second bracket SP2, respectively.

Figure 12:
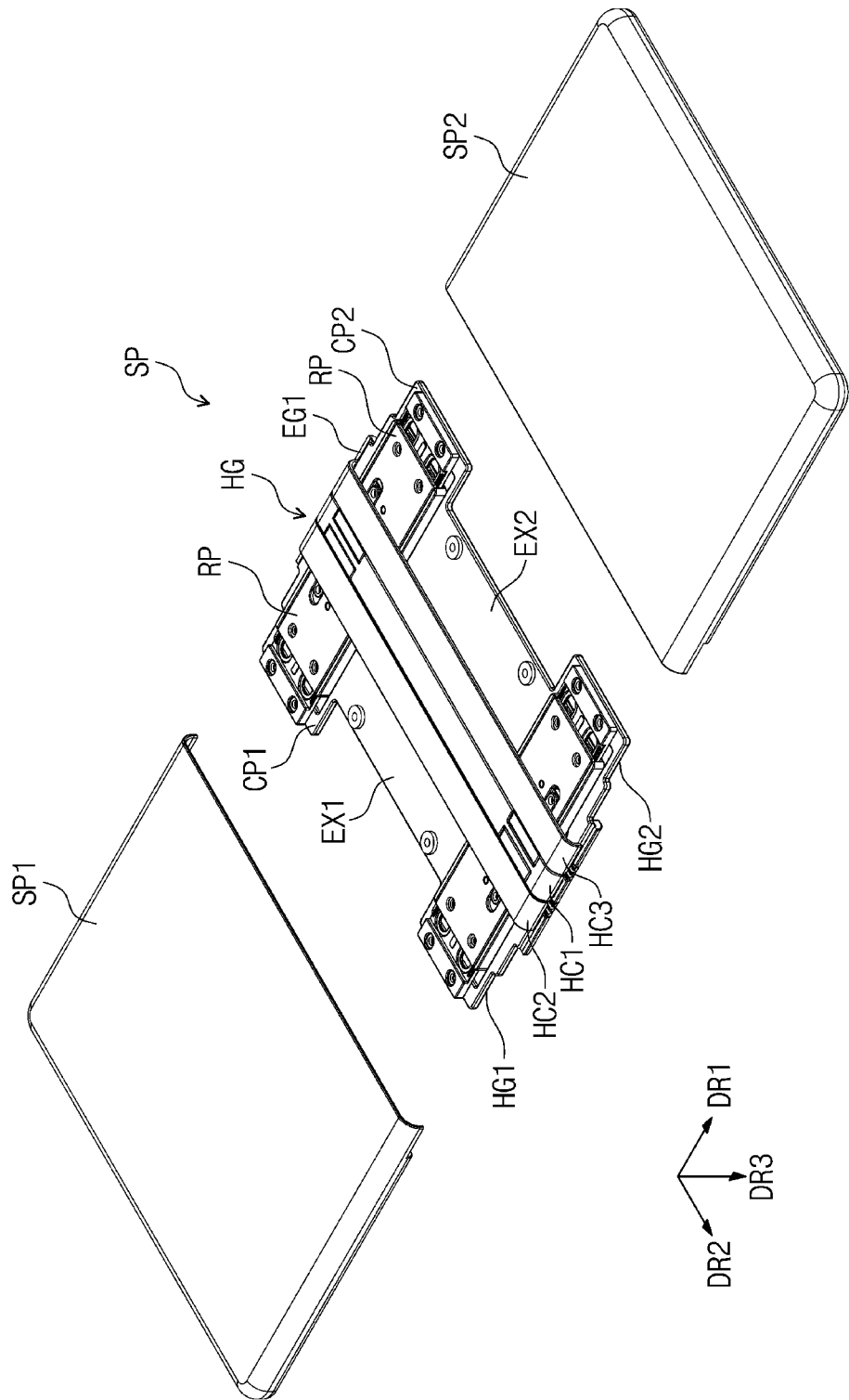
FIG. 12 is an exploded perspective view illustrating a rear surface of the bracket of FIG. 9.

Referring to FIG. 12, the first, second, and third hinge cover parts HC1, HC2, and HC3 may be disposed below the hinge HG. The bracket SP may include rotation parts RP disposed below the hinge HG. The rotation parts RP may be disposed below the first connection plates CP1 and below the second connection plates CP2. The rotation parts RP may be rotatably coupled to the hinge HG. The rotation parts RP illustrated in the figures are exemplary embodiments of one of various types of rotation parts, which may be formed and configured in various ways according to the principles of the invention. One specific exemplary configuration of the rotation parts RP will be described in detail below.

Figure 13:
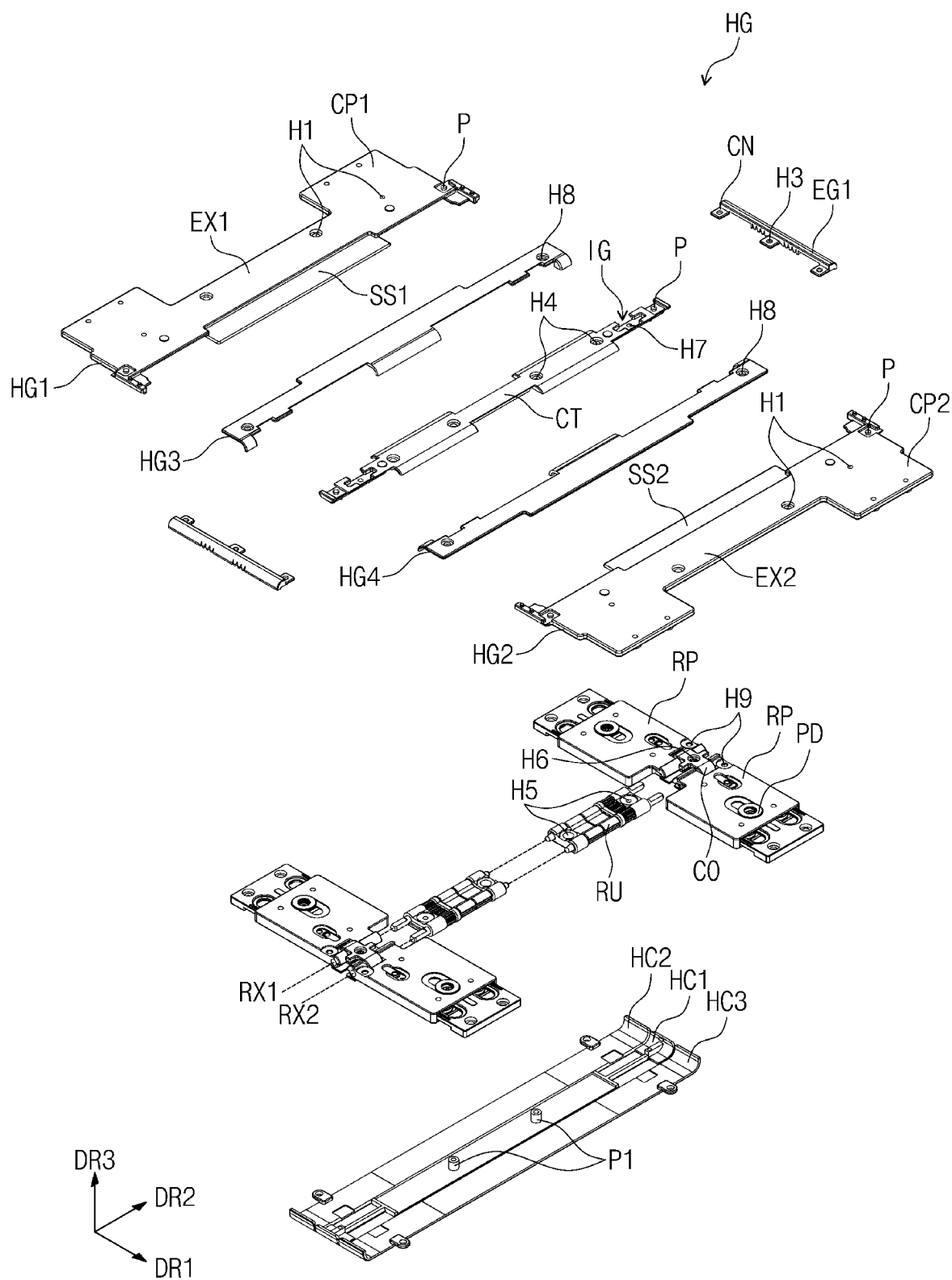
FIG. 13 is an exploded perspective view illustrating to a front surface of the hinge of FIG. 11.
Figure 14:
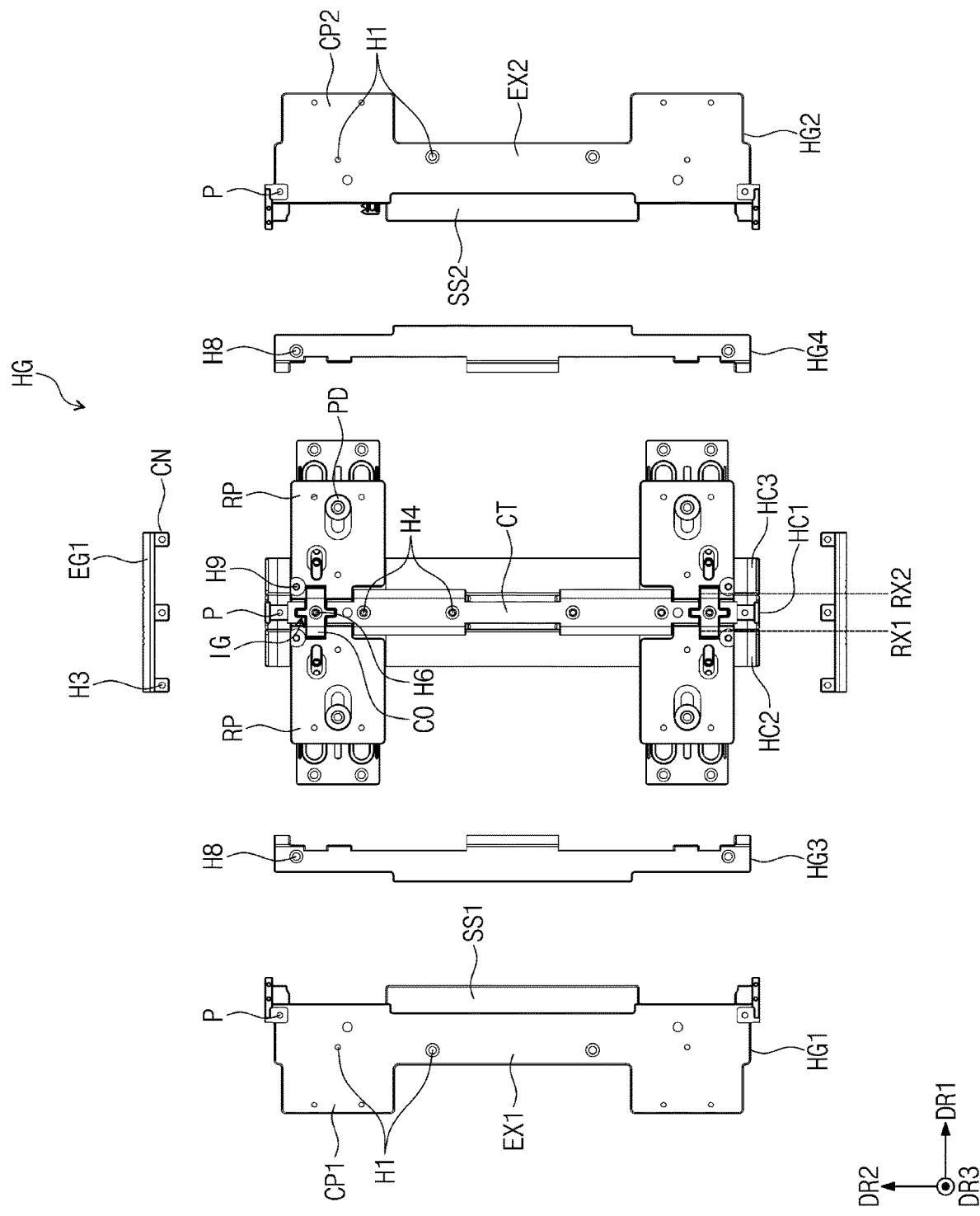
FIG. 14 is a bottom, plan view illustrating the central part, rotation parts, and coupling parts of FIG. 13 before they are attached together.

FIG. 13 is an exploded perspective view illustrating a front surface of the hinge of FIG. 11. FIG. 14 is a bottom, plan view illustrating the central part, rotation parts, and coupling parts of FIG. 13 before they are attached together.

Referring to FIGS. 13 and 14, the central part CT and the first, second, third, and fourth hinge parts HG1, HG2, HG3, and HG4 extend in the second direction DR2 so as to be arranged in the first direction DR1. The first edge parts EG1 may be disposed in the second direction DR2, and the central part CT may be disposed between the first edge parts EG1. The first hinge part HG1 and the second hinge part HG2 may have shapes that are symmetrical to each other. The third hinge part HG3 and the fourth hinge part HG4 may have shapes that are symmetrical to each other.

The first edge parts EG1 may extend in the first direction DR1. The hinge HG may include a plurality of connection parts CN that respectively protrude in the second direction DR2 from the first edge parts EG1. Third holes H3 may be defined in the connection parts CN.

The hinge HG may include a plurality of protrusions P that protrude from both sides of the central part CT, which are opposite to each other in the second direction DR2, both sides of the first hinge part HG1, which are opposite to each other in the second direction DR2, and both sides of the second hinge part HG2, which are opposite to each other in the second direction DR2, in the third direction DR3. As the protrusions P are inserted into the third holes H3, the first edge parts EG1 may be connected to the central part CT, the first hinge part HG1, and the second hinge part HG2.

The hinge HG may include a plurality of rotation axis units RU disposed below and overlapping the central part CT. The rotation axis units RU may be arranged in the second direction DR2. The rotation axis units RU may define the first and second rotation axes RX1 and RX2.

The two rotation axis units RU are illustrated, but the number of rotation axis units RU is not limited thereto. The rotation axis unit RU disposed at a relative upper side may have a structure that is symmetrical with the rotation axis unit RU disposed at a relative lower side with respect to the second direction DR2.

The rotation axis units RU may be connected to a lower portion of the central part CT. For example, fourth holes H4 may be defined in the central part CT, and fifth holes H5 may be defined in the rotation axis units RU. The fourth holes H4 may be disposed between the protrusions P of the central part CT. A plurality of connection pins may be inserted into the fourth holes H4 and the fifth holes H5 so that the rotation axis units RU are connected to the lower portion of the central part CT. A more detailed configuration of the rotation axis units RU will be described in detail below.

Insertion grooves IG may be defined in the central part CT. The insertion grooves IG may be disposed between the protrusions P of the central part CT and the fourth holes H4. The coupling parts CO may be inserted into the insertion grooves IG and connected to the central part CT. Also, the coupling parts CO may be inserted into the insertion grooves IG and coupled to the rotation parts RP. For example, FIG. 13 illustrates the coupling parts CO coupled to the rotation parts RP, and FIG. 14 illustrates the coupling parts CO inserted into the insertion grooves IG and coupled to the rotation parts RP.

Connection pins may be inserted into sixth holes H6 defined in the coupling parts CO and seventh holes H7 defined in the portion of the central part CT, in which the insertion grooves IG are defined, and thus, the coupling parts CO may be connected to the central part CT. Also, both sides of the coupling parts CO, which are opposite to each other in the first direction DR1, may be coupled to the rotation parts RP, respectively. The rotation parts RP may be rotatably coupled to the coupling parts CO. Hereinafter, the above-described constitutions will be described in detail.

The rotation parts RP may be disposed below and overlap the first and second hinge parts HG1 and HG2 and the third and fourth hinge parts HG3 and HG4. The rotation parts RP may be disposed in the first direction DR1 with the central part CT therebetween. The rotation parts RP may be coupled to the rotation axis units RU to rotate about the first and second rotating axes RX1 and RX2. A more detailed configuration of the rotation parts RP will be described in detail below.

A plurality of pads PD may be disposed on the rotation parts RP. Each of the pads PD may have a ring shape. The pads PD may include rubber.

Two rotation parts RP may be disposed in the first direction DR1 with the central part CT therebetween, and the other two rotation parts RP may be disposed in the first direction DR1 with the central part CT therebetween. The two rotation parts RP may be spaced apart from the rest two rotation parts RP in the second direction DR2. While the four rotation parts RP are shown, the number of rotation parts RP is not limited thereto. The rotation parts RP disposed in the first direction DR1 with the central part CT therebetween may be symmetrical to each other.

The third hinge part HG3 and the fourth hinge part HG4 may be connected to the rotation parts RP. For example, eighth holes H8 may be defined in both sides of the third hinge part HG3, which are opposite to each other in the second direction DR2, and both sides of the fourth hinge part HG4, which are opposite to each other in the second direction DR2. Ninth holes H9 may be defined in the rotation parts RP. Connection pins may be inserted into the eighth holes H8 and the ninth holes H9 so that the third and fourth hinge parts HG3 and HG4 may be connected to the rotation parts RP.

The first hinge cover part HC1 may be disposed below and overlap the central part CT. The second hinge cover part HC2 may be disposed below and overlap the third hinge part HG3. The third hinge cover part HC3 may be disposed below and overlap the fourth hinge part HG4.

The first hinge cover part HC1 may be disposed under the rotation axis units RU and connected to the rotation axis units RU. For example, the protrusions P1 protruding from the first hinge cover part HC1 may be inserted into the fifth holes H5. Since connection pins inserted into the fourth holes H4 and the fifth holes H5 are coupled to the protrusions P1, the first hinge cover part HC1 may be connected to the rotation axis units RU.

Figure 15:
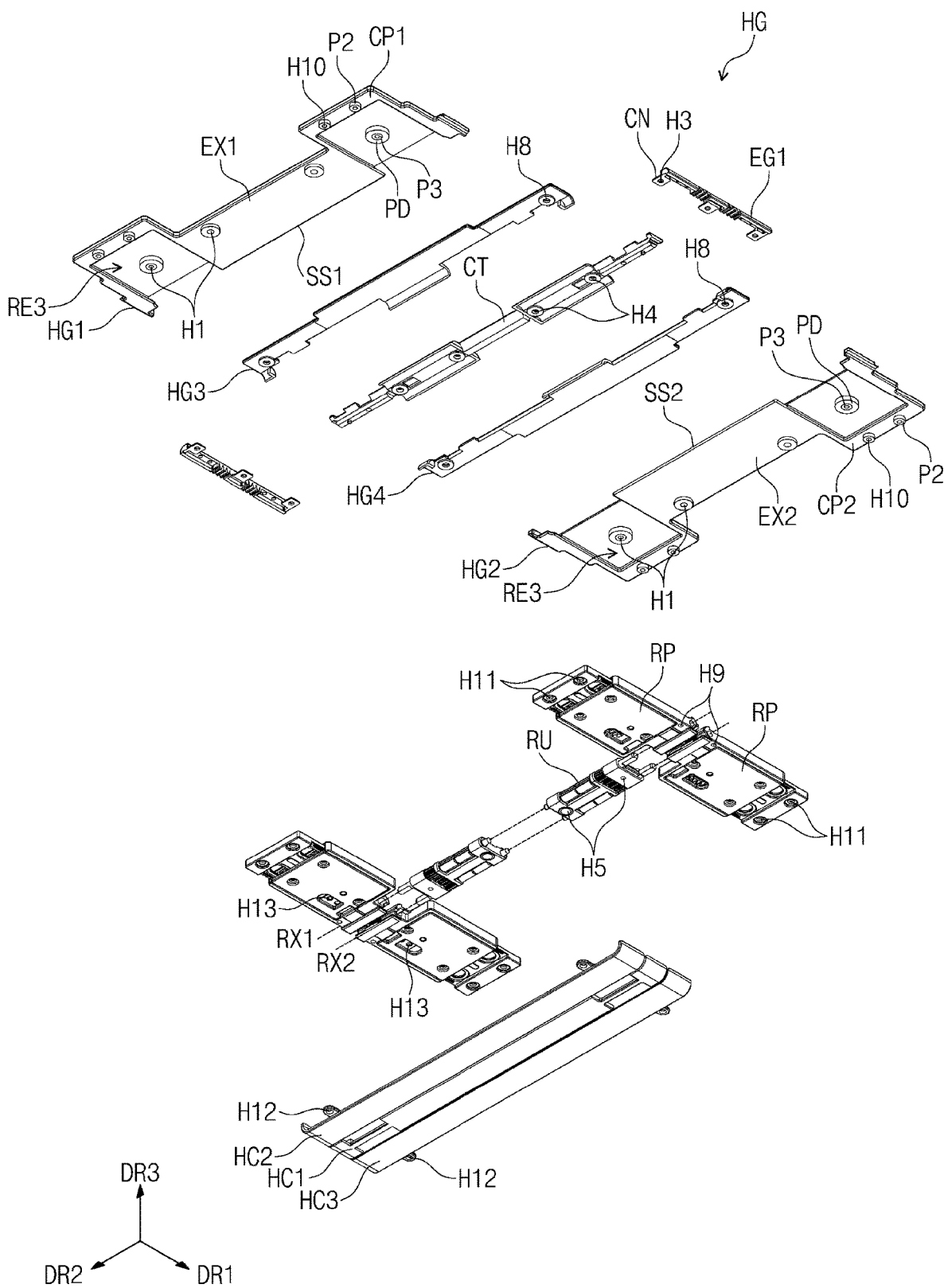
FIG. 15 is an exploded perspective view illustrating a rear surface of the hinge of FIG. 12.
Figure 16:
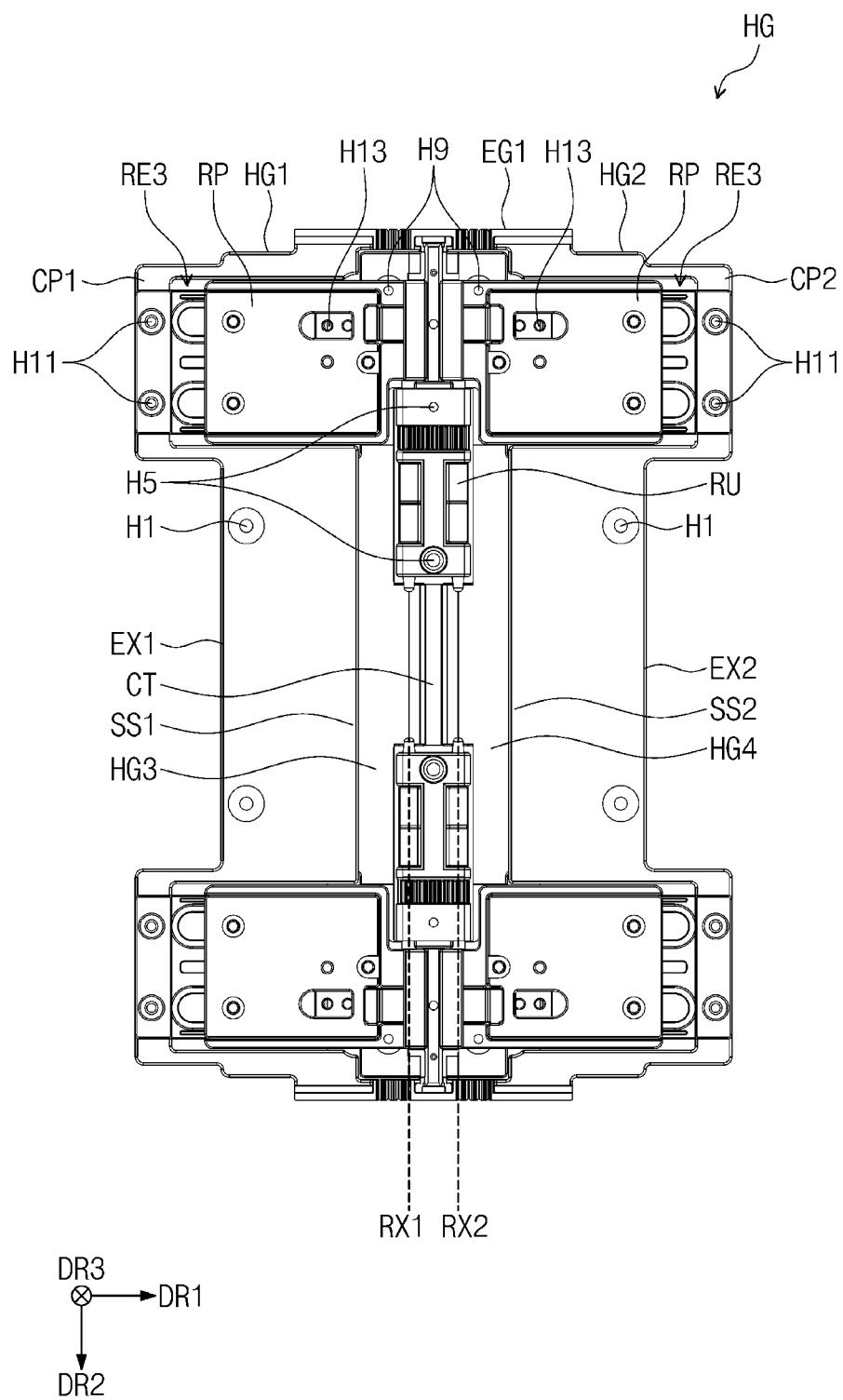
FIG. 16 is a bottom view illustrating the central part, first to fourth hinge parts, rotation axis units, and rotation parts of FIG. 15 after they have been attached together.

FIG. 15 is an exploded perspective view illustrating a rear surface of the hinge of FIG. 12. FIG. 16 is a bottom view illustrating the central part, first to fourth hinge parts, rotation axis units, and rotation parts of FIG. 15 after they have been attached together.

Referring to FIGS. 15 and 16, the rotation parts RP may be disposed below the first and second connection plates CP1 and CP2. The rotation parts RP may be disposed in the third recess part RE3 defined in rear surfaces of the first and second connection plates CP1 and CP2 and connected to the first and second connection plates CP1 and CP2. For example, tenth holes H10 may be defined in the first and second connection plates CP1 and CP2, and eleventh holes H11 may be defined in the rotation parts RP.

Connection pins may be inserted into the tenth holes H10 and the eleventh holes H11 so that the rotation parts RP are connected to the first and second connection plates CP1 and CP2. Tenth holes H10 may be defined in the plurality of protrusions P2 protruding from the rear surfaces of the first connection plates CP1 and CP2.

As described above, the first and second connection plates CP1 and CP2 may be connected to the first and second brackets SP1 and SP2. Thus, the rotation parts RP may be connected to the first and second brackets SP1 and SP2 through the first and second connection plates CP1 and CP2.

The second hinge cover part HC2 and the third hinge cover part HC3 may be connected to the rotation parts RP. For example, twelfth holes H12 may be defined in the second and third hinge cover parts HC2 and HC3, and thirteenth holes H13 may be defined in the rotation parts RP. Connection pins may be inserted into the twelfth holes H12 and the thirteenth holes H13 so that the second and third hinge cover parts HC2 and HC3 are connected to the rotation parts RP.

The second hinge cover part HC2 may be connected to the two rotation parts RP disposed at a left side of the central part CT with respect to the central part CT. The third hinge cover part HC3 may be connected to the two rotation parts RP disposed at a right side of the central part CT with respect to the central part CT.

The first holes H1 may be defined in the plurality of protrusions P3 protruding from the rear surfaces of the first and second connection plates CP1 and CP2. The pads PD may be inserted into the protrusions P3.

The rotation parts RP may have a lost motion structure in which some components of the rotation parts RP are moved, e.g. slid, with respect to other components. The configuration of the rotation parts RP may be more clearly seen in the perspective view of the rotation parts RP with respect to the rear surfaces of the rotation parts RP. Therefore, the perspective view of the rear surface of any one of the rotation parts will be described first, and then the perspective view of the rotation parts with respect to the front surface of the rotation parts will be described.

Figure 17:
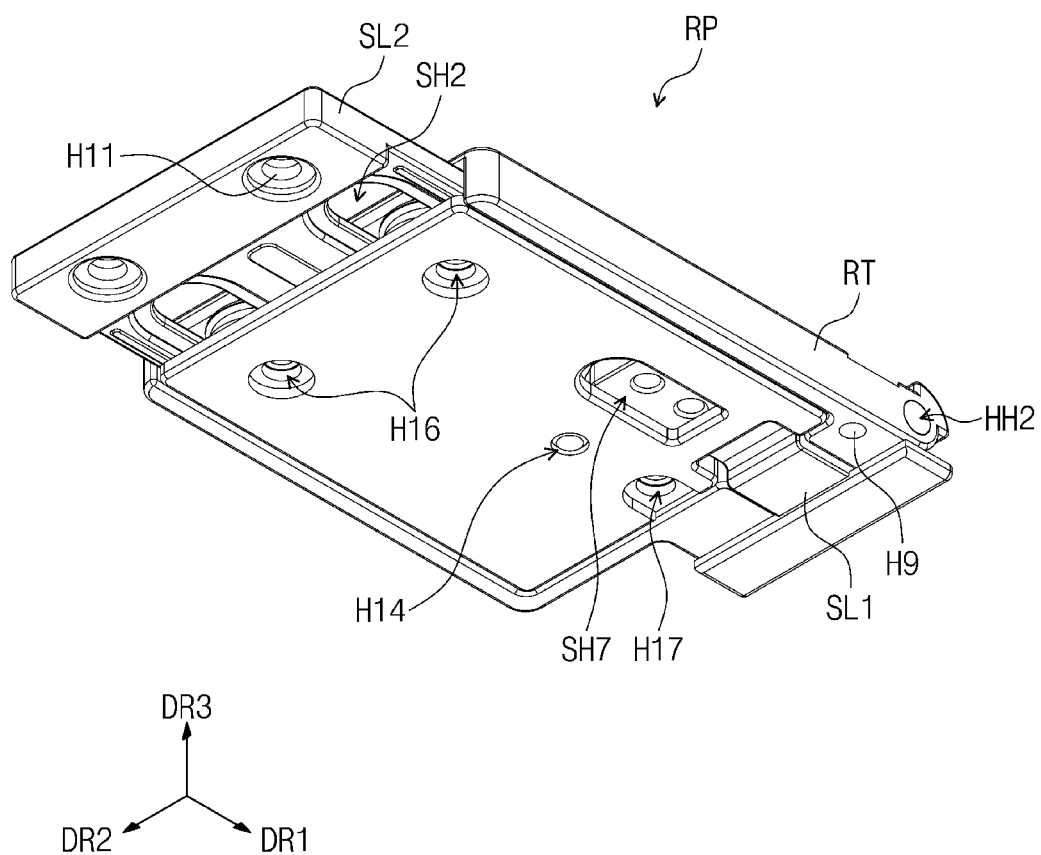
FIG. 17 is a perspective view illustrating a rear surface of an exemplary embodiment of the rotation part of FIG. 14.
Figure 18:
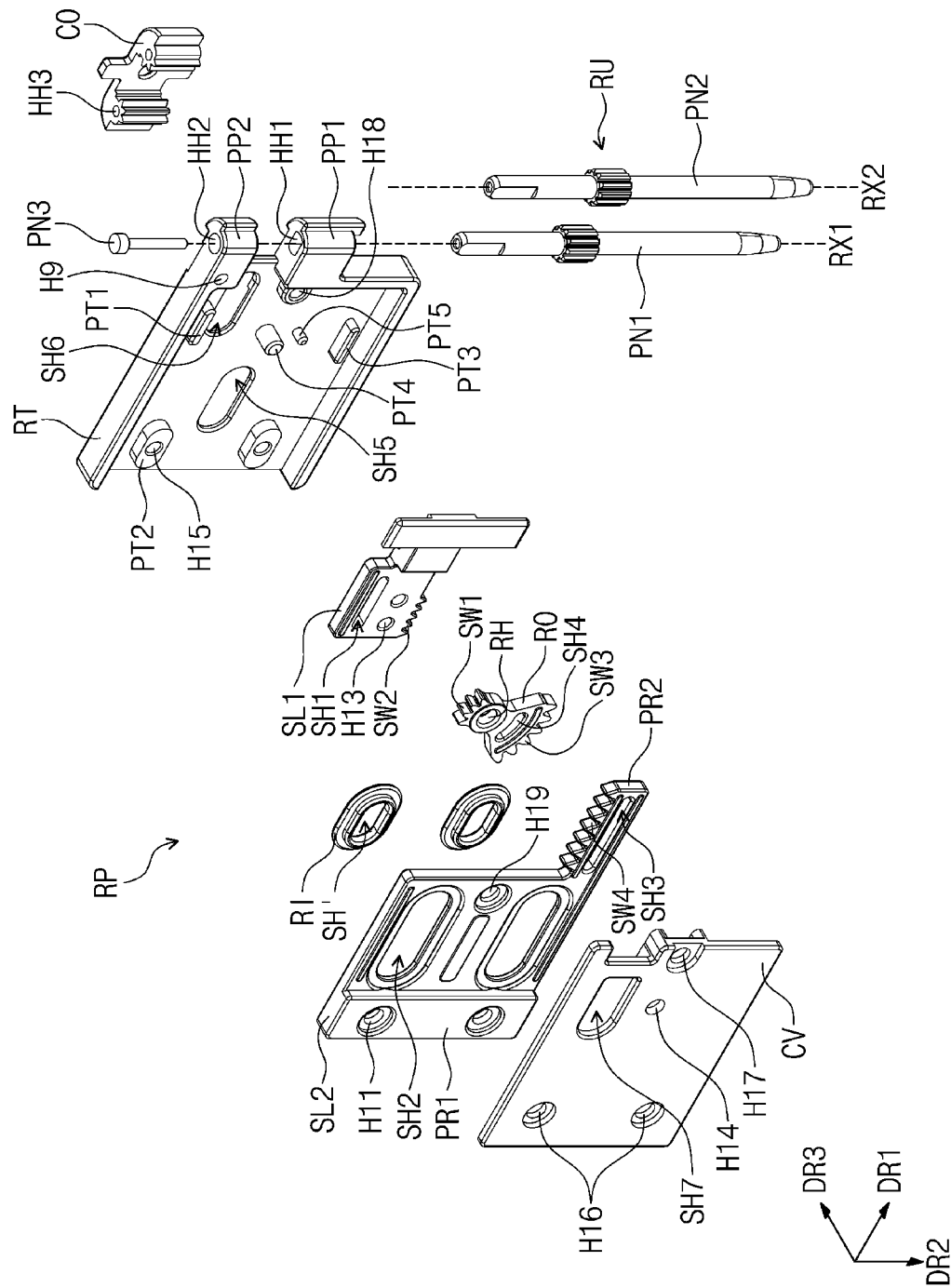
FIG. 18 is an exploded perspective view of the rotation part of FIG. 17.
Figure 19:
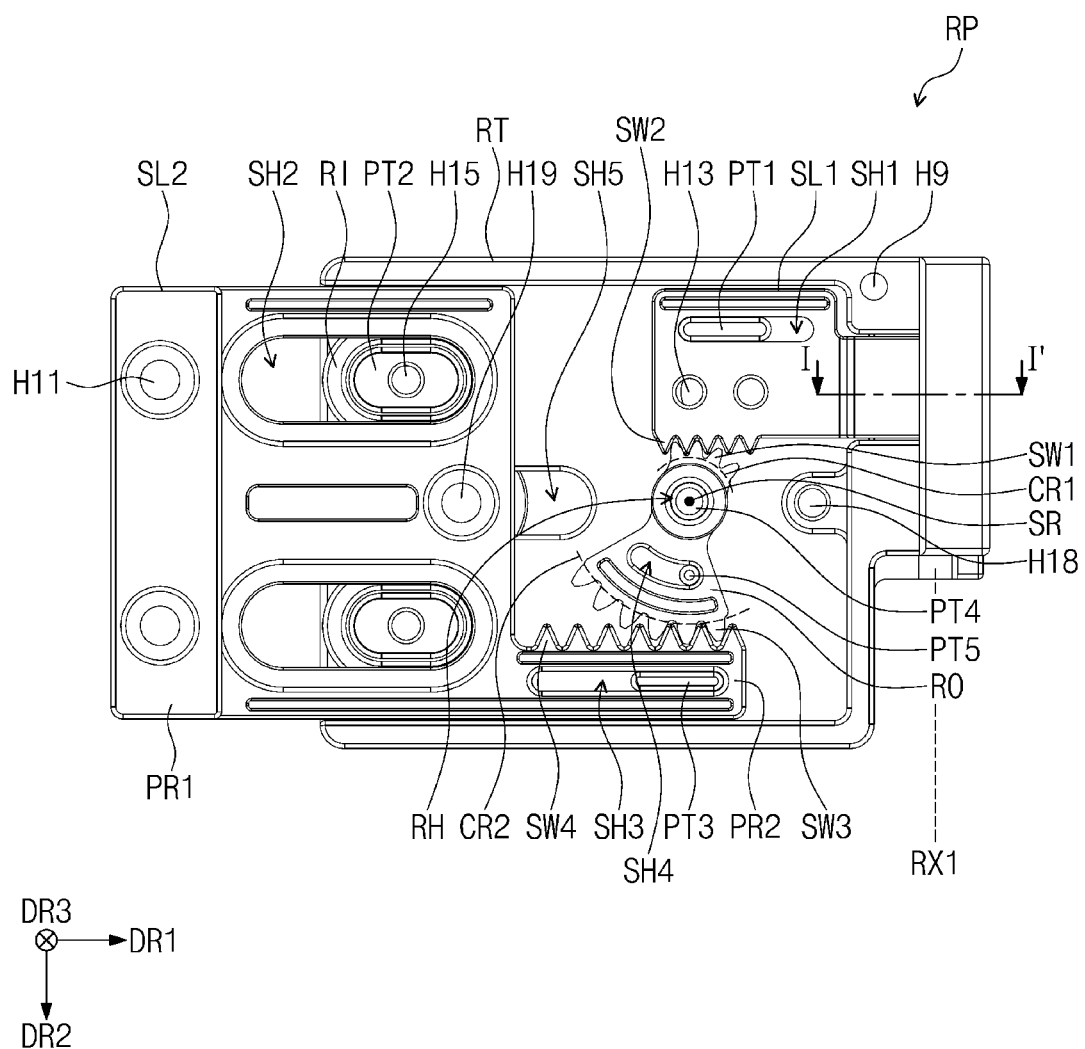
FIG. 19 is a bottom view illustrating the rotation plate, first and second sliding parts, and rotation unit of FIG. 18 coupled together.
Figure 20:
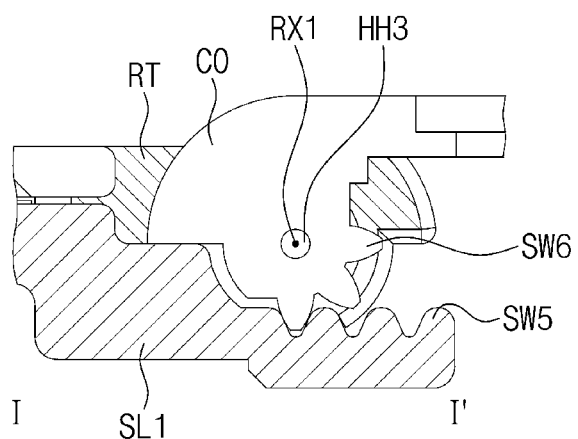
FIG. 20 is a cross-sectional view taken along line I-I' of FIG. 19.
Figure 20:
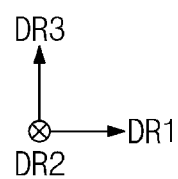

FIG. 17 is a perspective view illustrating a rear surface of an exemplary embodiment of the rotation part of FIG. 14. FIG. 18 is an exploded perspective view of the rotation part of FIG. 17. FIG. 19 is a bottom view illustrating the rotation plate, first and second sliding parts, and rotation unit of FIG. 18 coupled together. FIG. 20 is a cross-sectional view taken along line I-I' of FIG. 19.

The other rotation parts RP may have substantially the same configuration as the rotation part RP illustrated in FIGS. 17 and 18. For convenience of description, a top surface of the coupling part CO is illustrated in FIG. 20. Hereinafter, the first connection plate CP1 illustrated in FIGS. 15 and 16 will be described together for convenience of description.

Referring to FIGS. 17, 18, and 19, the rotation part RP provides a lost motion connection and may include a first sliding part SL1, a second sliding part SL2, a rotation unit RO, a rotation plate RT, and a cover part CV, a plurality of protrusions PT1 to PT5, and a plurality of ring units RI.

The cover part CV may be disposed under the rotation plate RT. The first and second sliding parts SL1 and SL2 and the rotation unit RO may be disposed between the rotation plate RT and the cover part CV. The rotation plate RT may be coupled to the rotation axis unit RU of the hinge HG so as to rotate about the corresponding first rotation axis RX1 of the first and second rotating axes RX1 and RX2.

For example, the rotation axis unit RU may include a first connection pin PN1 and a second connection pin PN2, which are spaced apart from each other in the first direction DR1 and extend in parallel to each other in the second direction DR2. The first connection pin PN1 may define the first rotation axis RX1. The second connection pin PN2 may define the second rotation axis RX2. Each of the first and second connection pins PN1 and PN2 may have a cylindrical shape extending in the second direction DR2.

The rotation plate RT may be coupled to rotate about the first connection pin PN1. For example, the first coupling hole HH1 extending in the second direction DR2 may be defined in the first sub protrusion PP1 protruding from one side of the rotation plate RT. As the first connection pin PN1 is inserted into the first coupling hole HH1, the rotation plate RT may rotate about the first rotation axis RX1.

The rotation plate RT of the other rotation part RP, which is symmetrical to the rotation part RP illustrated in FIG. 18, may be rotatably coupled to the second connection pin PN2 to rotate about the second rotation axis RX2.

The rotation plate RT may be rotatably coupled to the coupling part CO. For example, the second coupling hole HH2 extending in the second direction DR2 may be defined in the second sub protrusion PP2 protruding from one side of the rotation plate RT. The third coupling holes HH3 extending in the second direction DR2 may be defined at both sides of the coupling part CO, which are opposite to each other in the first direction DR1.

One side of the coupling part CO among the opposite sides of the coupling part CO, which are opposite to each other in the first direction DR1, may be disposed between the first sub protrusion PP1 and the second sub protrusion PP2. A third connection pin PN3 may be inserted into the second coupling hole HH2 and the third coupling hole HH3 defined in one side of the coupling part CO so that the rotation plate RT is rotatably coupled to one side of the coupling part CO. Since each of the third connection pin PN3, the second coupling hole HH2, and the third coupling hole HH3 has a cylindrical shape, the rotation plate RT may rotate about the coupling part CO.

The third connection pin PN3, the second coupling hole HH2, and the third coupling hole HH3 may overlap the first rotation axis RX1. Therefore, the rotation plate RT may be coupled to the coupling part CO to rotate about the first rotation axis RX1.

The rotation plate RT of the other rotation part RP, which is symmetrical to the rotation part RP illustrated in FIG. 18, may be rotatably coupled to the other side of the coupling part CO among both sides of the coupling part CO with respect to the second rotation axis RX2.

Referring to FIGS. 15, 16, 18, and 19, the rotation plate RT may be disposed in the third recess part RE3 defined in the first connection plate CP1. The rotation plate RT of the other rotation part RP that is symmetrical to the rotation part RP illustrated in FIG. 18 may be disposed in the third recess part RE3 defined in the second connection plate CP2.

A portion of the second sliding part SL2 may be exposed to the outside of the cover part CV and the rotation plate RT. A portion of the exposed second sliding part SL2 may be disposed on the rear surface of the first connection plate CP1 around the third recess part RE3. Eleventh holes H11 may be defined in the exposed portion of the second sliding part SL2. Tenth holes H10 may be defined in the rear surface of the first connection plate CP1 around the third recess part RE3.

The exposed portion of the second sliding part SL2 may be connected to a corresponding first hinge part HG1 of the first and second hinge parts HG1 and HG2. For example, pin units may be inserted into the tenth holes H10 and the eleventh holes H11 so that a portion of the second sliding part SL2 is connected to the first connection plate CP1. As described above, since the first hinge part HG1 is connected to the first bracket SP1, the exposed portion of the second sliding part SL2 may be connected to the corresponding first bracket SP1 through the first hinge part HG1.

A portion of the second sliding part SL2 of the other rotation part RP, which is symmetrical to the rotation part RP illustrated in FIG, may be connected to the second connection plate CP2 of the second hinge part HG2. Therefore, the part of the second sliding part SL2 of the other rotation part RP, which is symmetrical to the rotation part RP illustrated in FIG. 18, may be connected to the corresponding second bracket SP2 through the second hinge part HG2.

The first protrusion PT1 protruding from one surface of the rotation plate RT facing the cover part CV (for example, the rear side of the rotation plate) may extend in the first direction DR1 and be adjacent to the first rotation axis RX1. The first protrusion PT1 may be inserted into the first sliding hole SH1 defined in the first sliding part SL1 and extending in the first direction DR1.

A length of the first sliding hole SH1 in the first direction DR1 may be longer than a length of the first protrusion PT1. Thus, the first sliding part SL1 may move, slide and/or reciprocate along the first protrusion part PT1 in the first direction DR1 through the first sliding hole SH1 when the display device DD is folded and unfolded.

The plurality of second protrusions PT2 protruding from one surface of the rotation plate RT may be spaced apart from each other in the second direction DR2. The second protrusions PT2 may be further spaced apart from the first rotation axis RX1 than the first protrusion PT1 in the first direction DR1. For example, although the two second protrusions PT2 are illustrated, the number of second protrusions PT2 is not limited thereto, and at least one second protrusion PT2 may be disposed on the rotation plate RT. The second protrusions PT2 may extend in the first direction DR1.

The second protrusions PT2 may be respectively inserted into the second sliding holes SH2 defined in the second sliding part SL2 and extending in the first direction DR1. A length of each of the second sliding holes SH2 in the first direction DR1 may be longer than that of each of the second protrusions PT2. Thus, the second sliding part SL2 may move, slide and/or reciprocate along the second protrusions PT2 through the second sliding holes SH2 in the first direction DR1 when the display device DD is folded and unfolded.

The ring units RI may be disposed between the rotation plate RT and the second sliding part SL2. Sub sliding holes SH', each of which has a shape matching the second protrusions PT2, may be defined in the ring units RI. The second protrusions PT2 may be inserted into the sub sliding holes SH'. The ring units RI may be disposed on the rear surface of the rotation plate RT so as to be coupled to the second protrusions PT2.

The ring units RI may be inserted into the second sliding holes SH2. A length of each of the second sliding holes SH2 in the first direction DR1 may be longer than that of each of the ring units RI. Thus, the second sliding part SL2 may reciprocate along the ring units RI through the second sliding holes SH2 in the first direction DR1. The ring units RI may be omitted.

The second sliding part SL2 may include a first portion RP1 in which the second sliding holes SH2 and the eleventh holes H11 are defined and a second portion PR2 extending from the first portion PR1 in the first direction DR1. The second portion PR2 may extend toward the first rotation axis RX1 from one side (or a lower end of the first portion PR1) of both sides of the first portion PR1, which are opposite to each other in the second direction DR2. The second portion PR2 may face the first sliding part SL1 in the second direction DR2.

The third protrusion PT3 protruding from one surface of the rotation plate RT may extend in the first direction DR1. The third protrusion PT3 may be disposed below the first protrusion PT1 with respect to the second direction DR2.

A third sliding hole SH3 extending in the first direction DR1 may be defined in the second portion PR2. The third protrusion PT3 may be inserted into the third sliding hole SH3. A length of the third sliding hole SH3 may be longer than that of the third protrusion PT3. Thus, the second sliding part SL2 may move, slide and/or reciprocate along the third protruding part PT3 through the third sliding hole SH3 in the first direction DR1 when the display device DD is folded and unfolded.

The rotation unit RO may be disposed between the first sliding part SL1 and the second sliding part SL2 so as to be coupled to the first sliding part SL1 and the second sliding part SL2. The rotation unit RO may rotate by a predetermined range about the sub rotation axis SR parallel to the third direction DR3.

In detail, the rotation unit RO may be disposed between the first sliding part SL1 and the second portion PR2 so as to be coupled to the first sliding part SL1 and the second portion PR2. The fourth protrusion PT4 protruding from one surface of the rotation plate RT may have a cylindrical shape extending in the third direction DR3. The fourth protrusion PT4 may be disposed between the first protrusion PT1 and the third protrusion PT3. The fourth protrusion PT4 may be inserted into a circular rotation hole RH defined in the rotation unit RO.

The fourth protrusion PT4 may define the sub rotation axis SR. The rotation unit RO may rotate by a predetermined range about the fourth protrusion PT4 when the display device DD is folded and unfolded. As such, the rotation unit RO may rotate about the sub rotation axis SR perpendicular to the rotation axes of the rotation part RP, which are the first and second rotation axes RX1 and RX2.

The fifth protrusion PT5 protruding from one surface of the rotation plate RT may be disposed between the third protrusion PT3 and the fourth protrusion PT4. The fifth protrusion PT5 may be inserted into the fourth sliding hole SH4 defined in the rotation unit RO.

A first teeth part SW1 disposed at one side of the rotation unit RO facing the first sliding part SL1 may be engaged with a second teeth part SW2 disposed on a portion of the first sliding part SL1. The other side of the rotation unit RO, which is opposite to the one side of the rotation unit RO, may face the second portion PR2. The third teeth part SW3 defined on the other side of the rotation unit RO may be disposed to be engaged with the fourth teeth part SW4 defined on the second portion PR2. The fourth sliding hole SH4 may be defined between the rotation hole RH and the other side of the rotation unit RO.

The second teeth part SW2 and the fourth teeth part SW4 may extend in the first direction DR1. The length of the fourth teeth part SW4 in the first direction DR1 may be greater than that of the second teeth part SW2. The number of teeth of the second teeth SW2 may be less than that of teeth of the fourth teeth SW4.

As illustrated in FIG. 19, the teeth of the first teeth SW1 may be arranged in a first virtual curve CR1 having a first curvature. The teeth of the third teeth part SW3 may be arranged in a second virtual curve CR2 having a second curvature. The first curvature may be greater than the second curvature, and the first curve CR1 may have a length less than that of the second curve CR2. The number of teeth of the first teeth SW1 may be less than that of teeth of the third teeth SW3. Since the distance between the sub rotation axis SR and the first virtual curve CR1 is less than the distance between the sub rotation axis SR and the second virtual curve CR2 and the rotation unit RO rotates about the sub rotation axis SR, the first sliding part SL1 travels a distance shorter than the second sliding part SL2.

The fourth sliding hole SH4 may substantially extend in a curved shape having the second curvature. The fourth sliding hole SH4 may extend in a curved shape longer than the fifth protrusion PT5. When the rotation unit RO rotates, the rotation unit RO may move along the fifth protrusion PT5 through the fourth sliding hole SH4 to rotate by the predetermined range.

The cover part CV may be connected to the rotation plate RT. For example, the fourth protrusion PT4 may be inserted into a fourteenth hole H14 defined in the cover part CV. Connection pins may be inserted into a fifteenth holes H15 defined in the second protrusions PT2 and a sixteenth holes H16 defined in the cover part CV. Connection pins may be inserted into a seventeenth hole H17 defined in the cover part CV and an eighteenth hole H18 defined in the rotation plate RT. As a result, the cover part CV may be connected to the rotation plate RT.

The fourteenth hole H14 may be disposed between the sixteenth holes H16 and the seventeenth hole H17. The fourth protrusion PT4 may be disposed between the fifteenth holes H15 and the eighteenth hole H18.

A nineteenth hole H19 may be defined in the first portion PR1. The nineteenth hole H19 may overlap a fifth sliding hole SH5 defined in the rotation plate RT. The fifth sliding hole SH5 may extend in the first direction DR1. The protrusion P3 on which the pad PD is disposed may be inserted into a nineteenth hole H19 through a fifth sliding hole SH5. Connection pins may be inserted into the nineteenth hole H19 and the first hole H1 defined in the protrusion P3 so that the second sliding part SL2 is connected to the first connection plate CP1.

A plurality of thirteenth holes H13 may be defined in the first sliding part SL1. The thirteenth holes H13 may overlap a sixth sliding hole SH6 defined in the rotation plate RT and a seventh sliding hole SH7 defined in the cover CV. The sixth and seventh sliding holes SH6 and SH7 may extend in the first direction DR1.

The thirteenth holes H13 may be arranged in the first direction DR1. A second hinge cover part HC2 may be connected to one of the thirteenth holes H13. For example, the second hinge cover part HC2 may be connected to the thirteenth hole H13 disposed at a left side of the thirteenth holes H13. The third hinge cover part HC3 may be connected to the thirteenth hole H13 disposed at a right side of the thirteenth holes H13 defined in the first sliding part SL1 of the other rotation part PR that is symmetrical to the rotation part RP of FIG. 18.

One side of the first sliding part SL1 may extend in the second direction DR2 to overlap the first rotation axis RX1. One side of the first sliding part SL1 of the other rotation part RP which is symmetrical to the rotation part RP of FIG. 18 may extend in the second direction DR2 to overlap the second rotation axis RX2.

Referring to FIGS. 19 and 20, the first sliding part SL1 may be coupled to the coupling part CO of the hinge HG to rotate about the corresponding first rotation axis RX1 of the first and second rotation axes RX1 and RX2.

As illustrated in FIG. 20, the fifth teeth part SW5 defined on an upper portion of one side of the first sliding part SL1 overlapping the first rotation axis RX1 may be disposed to be engaged with the sixth teeth part SW6 defined on a lower portion of one side of the coupling part CO. The sixth teeth SW6 may be disposed along a virtual curve having the first rotation axis RX1 as a center point.

According to this structure, when the rotation plate RT rotates about the first rotation axis RX1, the first sliding part SL1 may rotate about the first rotation axis RX1 while the fifth teeth part SW5 is engaged with the sixth teeth part SW6. That is, the first sliding part SL1 may be coupled to a lower portion of one side of the coupling part CO to rotate about the first rotation axis RX1.

The fifth teeth part SW5 defined on an upper portion of one side of the first sliding part SL1, which is symmetrical to the first sliding part SL1 of FIG. 20, may be disposed to be engaged with the sixth teeth part SW6 defined on a lower portion of the other side of the coupling part CO. That is, one side of the first sliding part SL1 that is symmetrical to the first sliding part SL1 of FIG. 20 may be coupled to a lower portion of the other side of the coupling part CO to rotate about the second rotation axis RX2.

Figure 21:
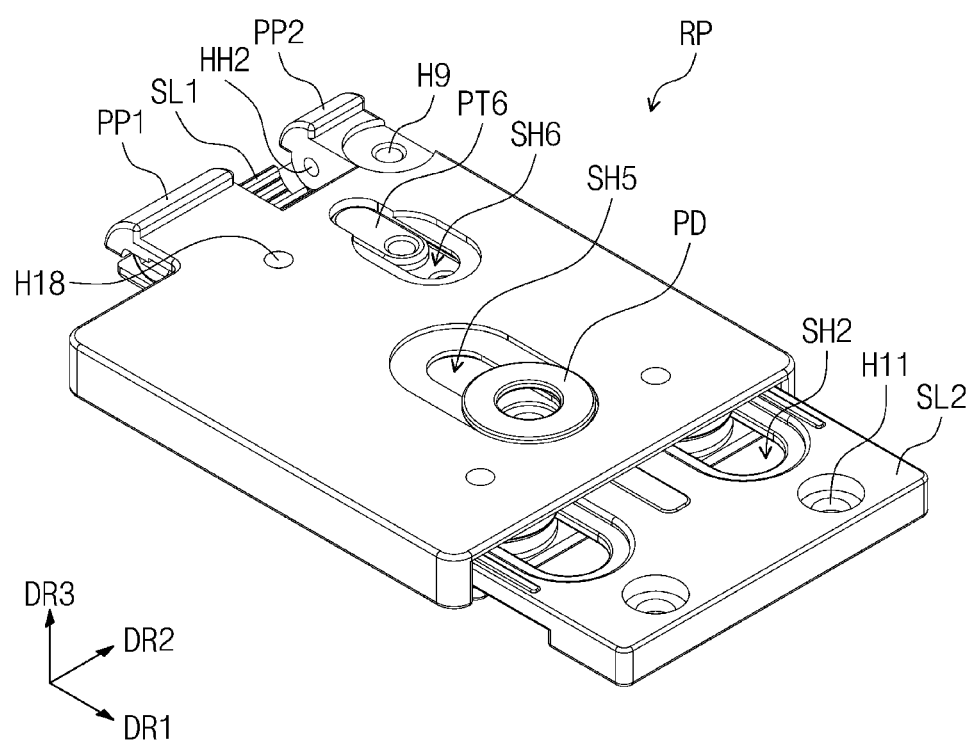
FIG. 21 is a perspective view illustrating a front surface of the rotation part of FIG. 17.
Figure 22:
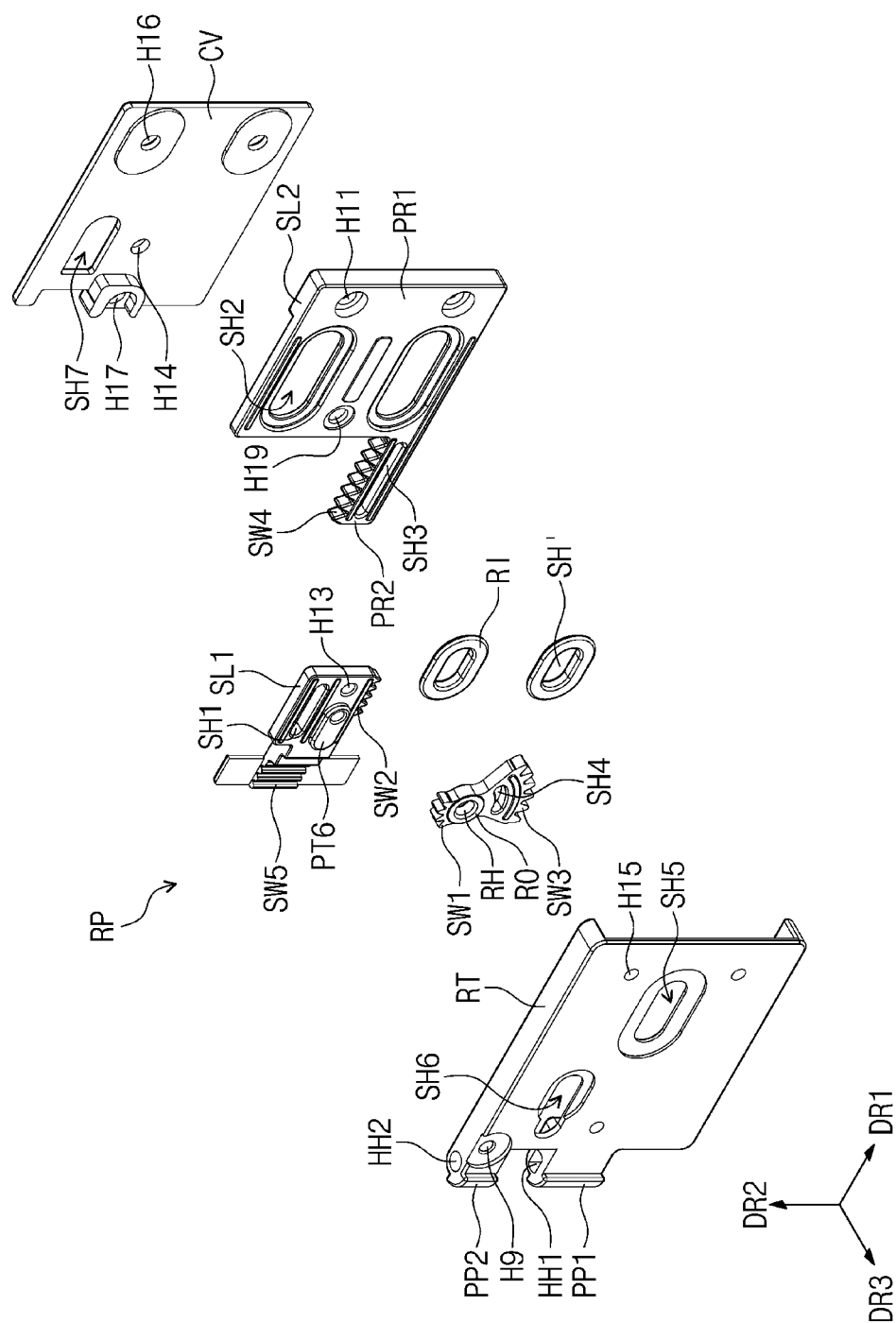
FIG. 22 is an exploded perspective view of the rotation part of FIG. 21.

FIG. 21 is a perspective view illustrating a front surface of the rotation part of FIG. 17. FIG. 22 is an exploded perspective view of the rotation part of FIG. 21.

Hereinafter, the configuration of the rotation unit, which is not described in FIGS. 17 to 20, will be mainly described.

Referring to FIGS. 21 and 22, the sixth protrusion part PT6 protruding from the front surface of the first sliding part SL1 may be inserted into the sixth sliding hole SH6. Each of the third and fourth hinge parts HG3 and HG4 illustrated in FIG. 13 may be inserted into a ninth hole H9 defined in the corresponding rotation plate RT. The ninth hole H9 may be adjacent to the second sub protrusion PP2.

In FIG. 15, each of the pads PD disposed on the protrusions P3 may be disposed to overlap the fifth sliding hole SH5. The pads PD may be disposed between the rotation plates RT and the first and second connection plates CP1 and CP2 to prevent abrasion from occurring between the rotation plates RT and the first and second connection plates CP1 and CP2.

The first sliding part SL1 and the second sliding part SL2 may move in the first direction DR1 between the rotation plate RT and the cover part CV. This operation will be described in detail below.

Figure 23:
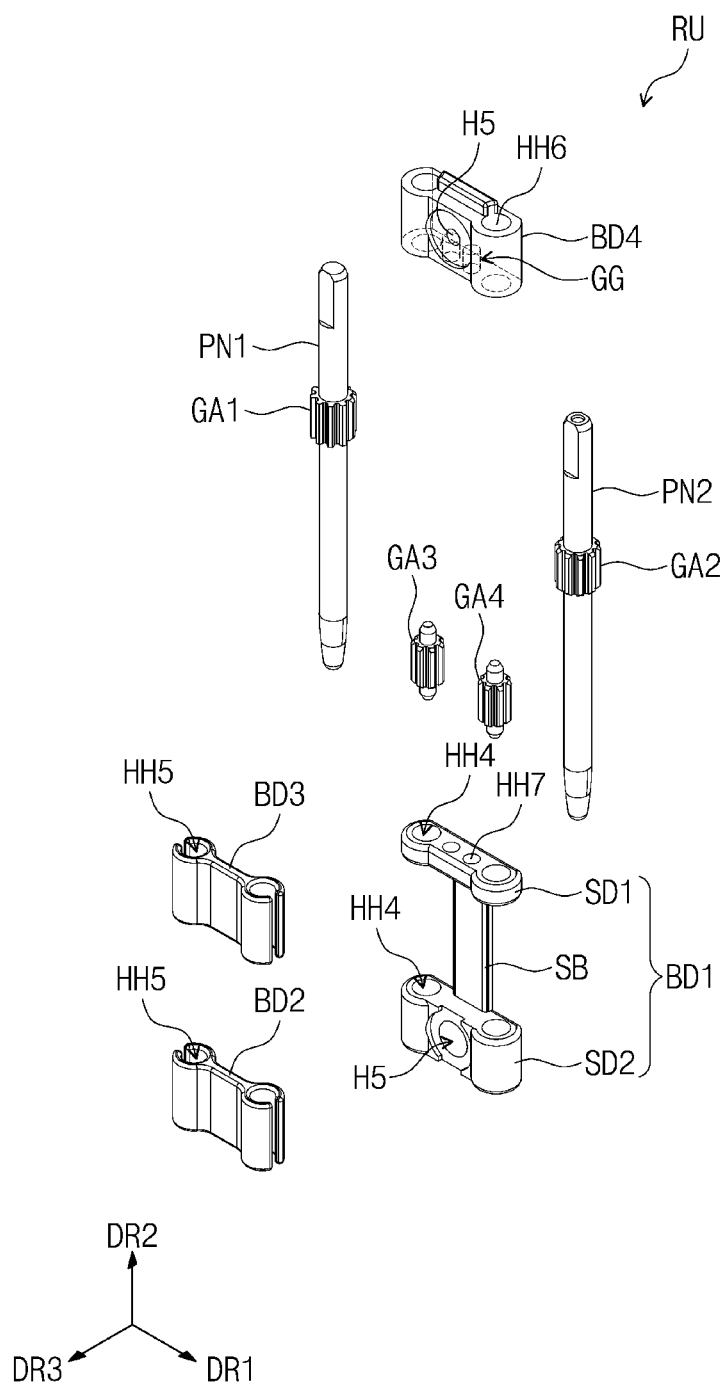
FIG. 23 is an exploded perspective view of a representative rotation axis unit of FIG. 13.

FIG. 23 is an exploded perspective view of a representative rotation axis unit of FIG. 13.

The other rotation axis unit RU illustrated in FIG. 13 may have substantially the same configuration as the rotation axis unit RU illustrated in FIG. 23. The rotation axis unit RU illustrated in FIG. 16 will be described together as required for the description below.

Referring to FIGS. 16 and 23, the rotation axis unit RU may include a first body part BD1, a second body part BD2, a third body part BD3, a fourth body part BD4, and a first gear part GA1, a second gear part GA2, a third gear part GA3, a fourth gear part GA4, a first connection pin PN1, and a second connection pin PN2.

The first body part BD1 may include a first sub body part SD1, a second sub body part SD2 spaced apart from the first sub body part SD1 in the second direction DR2, and a support bar SB extending in the second direction DR2. The first and second sub body parts SD1 and SD2 may be disposed on both sides of the support bar SB, which are opposite to each other in the second direction DR2. In the plan view, the second sub body part SD2 may be disposed below the first sub body part SD1.

The second body part BD2 and the third body part BD3 may be arranged in the second direction DR2 and disposed on the support bar SB. The second body part BD2 and the third body part BD3 may be disposed between the first sub body part SD1 and the second sub body part SD2.

The fourth body part BD4 may be arranged together with the first body part BD1 in the second direction DR2. The fourth body part BD4 may be disposed above the first body part BD1 with respect to the second direction DR2.

Each of the first connection pin PN1 and the second connection pin PN2 may have a cylindrical shape extending in the second direction DR2 and may be spaced apart from each other in the first direction DR1. The first gear part GA1 may be disposed on an outer circumferential surface of a portion of the first connection pin PN1. The second gear part GA2 may be disposed on an outer circumferential surface of a portion of the second connection pin PN2.

The third gear part GA3 and the fourth gear part GA4 may be disposed between the first gear part GA1 and the second gear part GA2. The first gear part GA1, the second gear part GA2, the third gear part GA3, and the fourth gear part GA4 may be disposed to be engaged with each other.

Fourth coupling holes HH4 extending in the second direction DR2 and disposed in the first direction DR1 may be defined in the first and second sub body parts SD1 and SD2, respectively. Fifth coupling holes HH5 extending in the second direction DR2 and disposed in the first direction DR1 may be defined in the second and third body parts BD2 and BD3, respectively. Sixth coupling holes HH6 extending in the second direction DR2 and disposed in the first direction DR1 may be defined in the fourth body part BD4.

Portions of the first and second connection pins PN1 and PN2, which are disposed below the first and second gear parts GA1 and GA2, may be inserted into the fourth coupling holes HH4 and the fifth coupling holes HH5. Portions of the first and second connection pins PN1 and PN2, which are disposed above the first and second gear parts GA1 and GA2, may be inserted into the sixth coupling holes HH6. The first, second, third, and fourth body parts BD1, BD2, BD3, and BD4 may be coupled to each other by the first and second connection pins PN1 and PN2.

The first and second connection pins PN1 and PN2 may rotate in the fourth, fifth and sixth coupling holes HH4, HH5, and HH6, each of which has a cylindrical shape. The first connection pin PN1 and the second connection pin PN2 may rotate in opposite directions about the first rotation axis RX1 and the second rotation axis RX2, respectively. The first and second gear parts GA1 and GA2 may rotate together with the first and second connection pins PN1 and PN2 in opposite directions.

Portions of the first and second connection pines PN1 and PN2, which are adjacent to upper sides of the first and second connection pines PN1 and PN2 may pass through the sixth coupling holes HH6 and then be inserted into the first coupling holes HH1, which is described with reference to FIG. 18, as described above.

The fifth hole H5 may be defined in the second sub body part SD2 and the fourth body part BD4. The fifth hole H5 defined in the second sub body part SD2 may be disposed between the fourth coupling holes HH4 defined in the second sub body part SD2. The fifth hole H5 defined in the fourth body part BD4 may be disposed between the sixth coupling holes HH6 defined in the fourth body part BD4.

Seventh coupling holes HH7 extending from the first sub body part SD1 in the second direction DR2 and disposed in the first direction DR1 may be defined in the first sub body part SD1. The seventh coupling holes HH7 may be disposed between the fourth coupling holes HH4 defined in the first sub body part SD1. Coupling grooves GG extending in the second direction DR2 and disposed in the first direction DR1 may be defined in the fourth body part BD4. The coupling grooves GG may be disposed between the sixth coupling holes HH6 defined in the fourth body portion BD4.

Upper ends of the third and fourth gears GA3 and GA4 may be inserted into the coupling grooves GG, and lower ends of the third and fourth gear parts GA3 and GA4 may be inserted into the seventh coupling holes HH4 with respect to the second direction DR2. As a result, the third and fourth gear parts GA3 and GA4 may be coupled to the first body part BD1 and the fourth body part BD4. The third and fourth gear parts GA3 and GA4 may rotate in opposite directions according to the rotation of the first and second gear parts GA1 and GA2.

Figure 24:
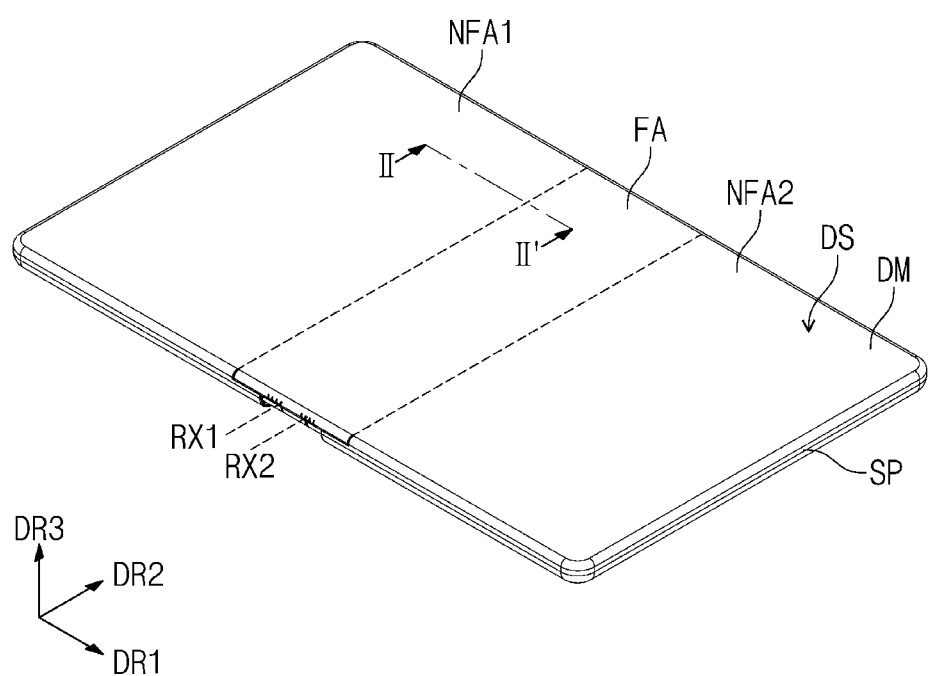
FIG. 24 is a perspective view of the display device of FIG. 6.
Figure 25:
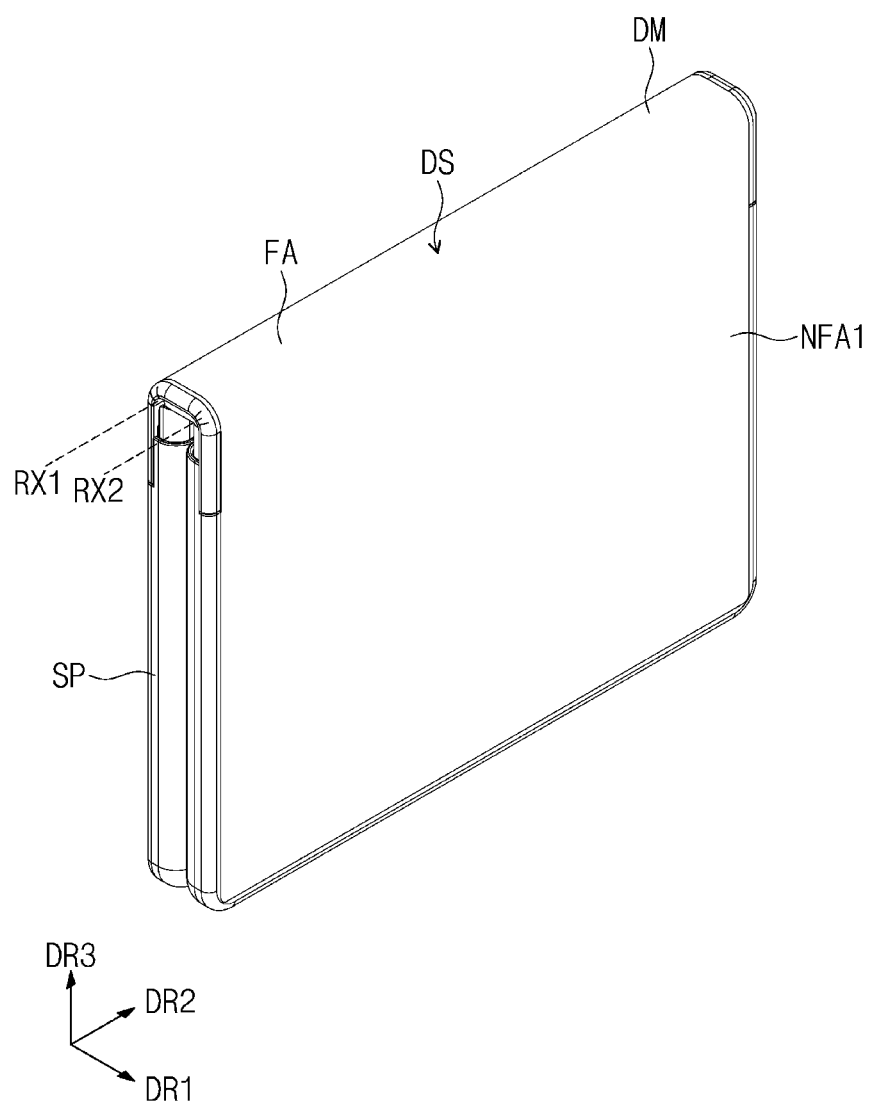
FIG. 25 is a perspective view illustrating a folded position of the display device of FIG. 24.

FIG. 24 is a perspective view of the display device of FIG. 6. FIG. 25 is a perspective view illustrating a folded position of the display device of FIG. 24.

Referring to FIGS. 24 and 25, the display device DD may be folded about the first rotation axis RX1 and the second rotation axis RX2. The bracket SP may be bent about the first and second rotation axes RX1 and RX2 to fold the display module DM. The folding area FA of the display module DM may be bent about the first rotation axis RX1 and the second rotation axis RX2. The display device DD may be out-folded so that the display surface DS of the display module DM is exposed to the outside.

Figure 26:
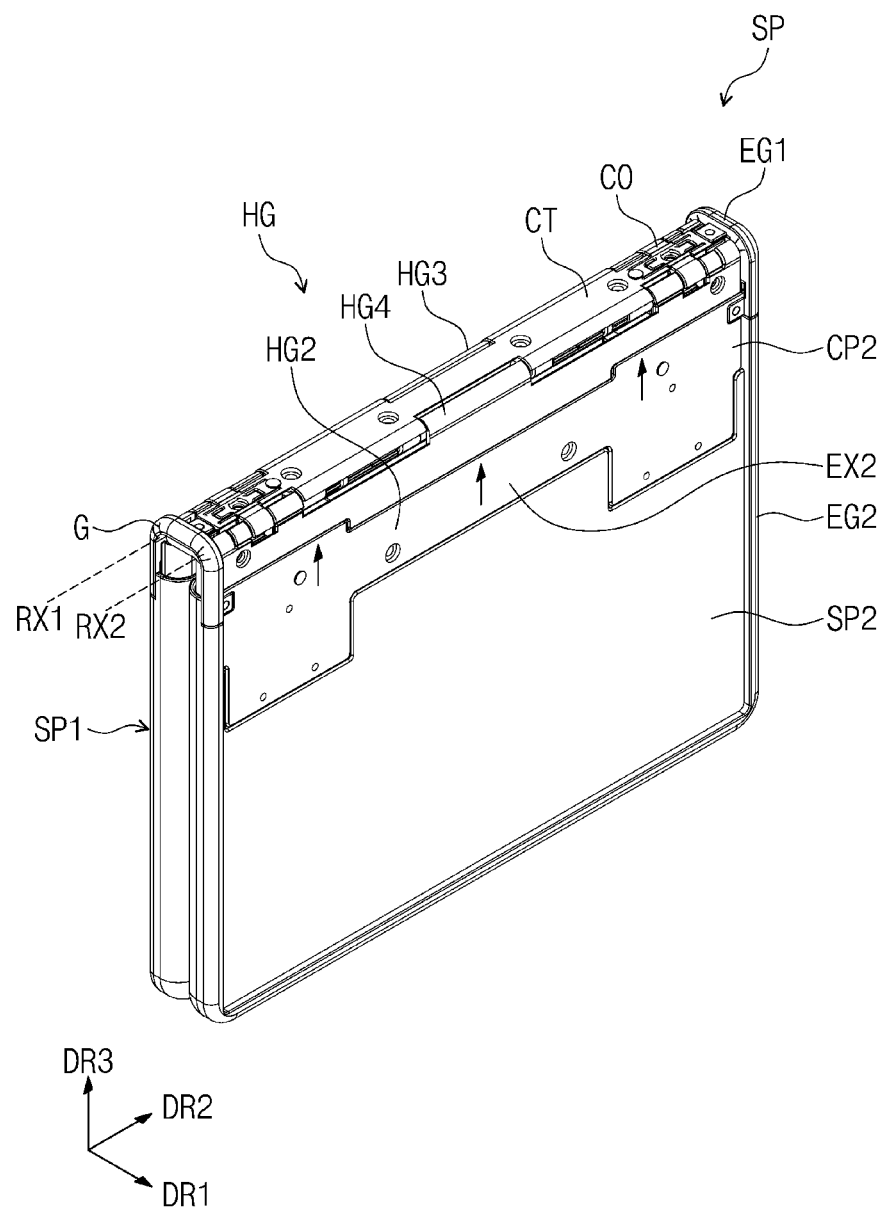
FIG. 26 is a perspective view of a folded bracket of the display device of FIG. 25.

FIG. 26 is a perspective view of a folded bracket of the display device of FIG. 25.

FIG. 8 will be described together with FIG. 26 as required for the description below.

Referring to FIGS. 8 and 26, the hinge HG may rotate about the first rotation axis RX1 and the second rotation axis RX2. Portions of the first edge parts EG1 overlapping the first and second rotation axes RX1 and RX2 may be more easily bent by the grooves G defined in the first edge parts EG1.

When the display device DD is folded, the second hinge part HG2 may be slid to move toward the fourth hinge part HG4. One side of the second extension part EX2 and one side of the fourth hinge part HG4 may be adjacent to each other, and the second sub support plate SS2 may move below the fourth hinge part HG4 and be disposed below the fourth hinge part HG4.

When the display device DD is folded, the first hinge part HG1 may be slid toward the third hinge part HG3 to move. One side of the first extension part EX1 and one side of the third hinge part HG3 may be adjacent to each other, and the first sub support plate SS1 may move below the third hinge part HG3 and be disposed below the third hinge part HG3.

Figure 27:
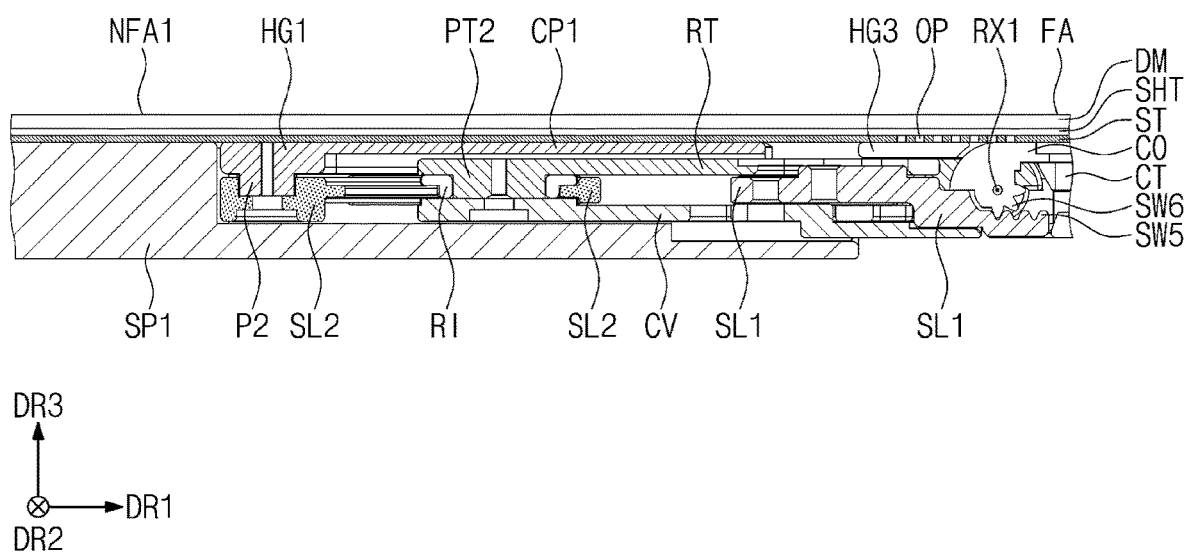
FIG. 27 is a cross-sectional view taken along line II-II' of FIG. 24.

FIG. 27 is a cross-sectional view taken along line II-II' of FIG. 24.

FIGS. 8 and 19 will be described together with FIG. 27 as required for the description below.

Referring to FIGS. 8 and 27, a support plate ST may be disposed on the bracket SP, a sheet part SHT may be disposed on the support plate ST, and the display module DM may be disposed on the sheet part SHT.

The support plate ST may be attached to the central part CT, the coupling part CO, the first hinge part HG1, and the first bracket SP1. For example, the support plate ST may be attached to the central part CT, the coupling part CO, the first hinge part HG1, and the first bracket SP1 by an adhesive. The adhesive may include a pressure sensitive adhesive. The support plate ST may not be attached to the third hinge part HG3.

The support plate ST may be attached to the second hinge part HG2 and the second bracket SP2 by the adhesive so as to be symmetrical to each other. The support plate ST may not be attached to the fourth hinge part HG4. Since the lost motion connection configuration of the first and second sliding parts SL1 and SL2, the rotation plate RT, the cover part CV, and the first hinge part HG1 have been described in detail above, description thereof will be omitted.

Referring to FIGS. 19 and 27, when the display device DD is unfolded, the first sliding part SL1 and the second sliding part SL2 may be spaced apart from each other in the first direction DR1. Also, referring to FIGS. 8 and 27, the first connection plate CP1 of the first hinge part HG1 and the third hinge part HG3 may be spaced apart from each other in the first direction DR1.

Figure 28:
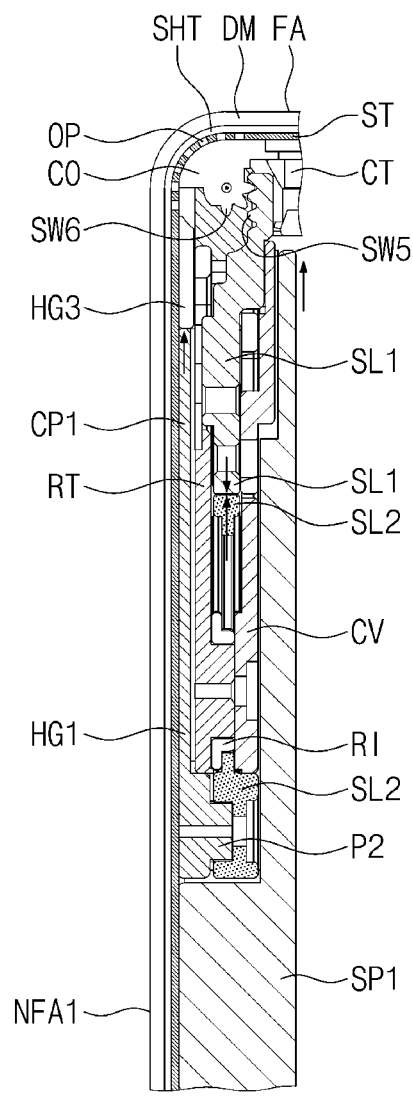
FIG. 28 is a cross-sectional view illustrating the rotation part of the folded display device of FIG. 25.
Figure 29:
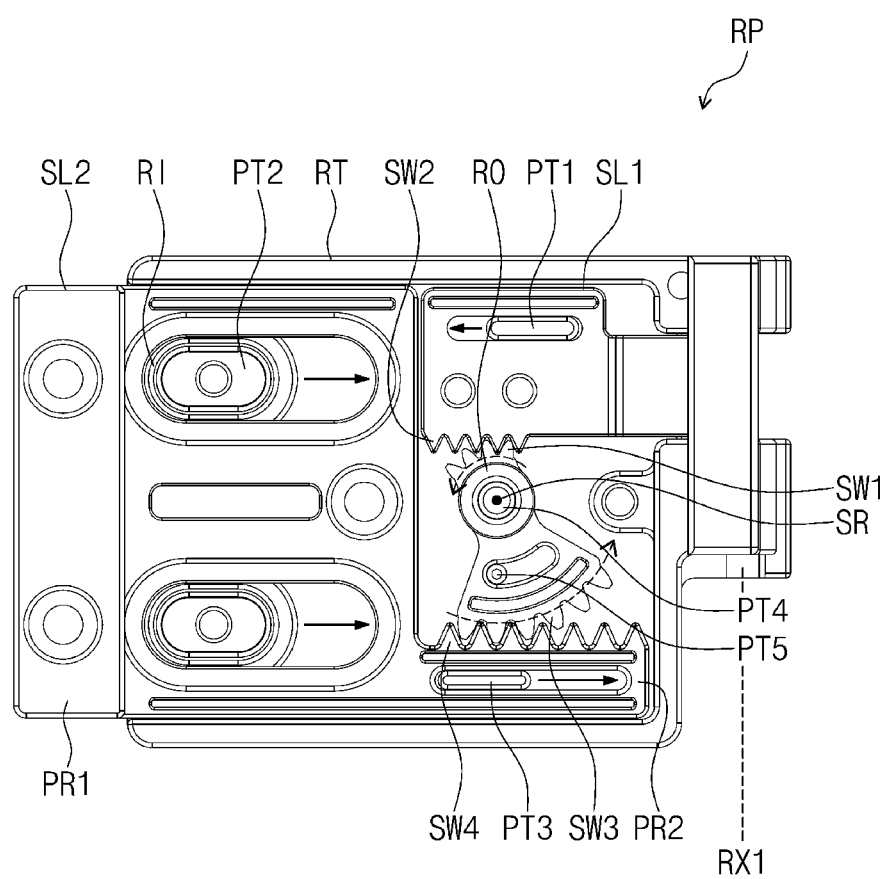
FIG. 29 is a bottom view illustrating the first and second sliding parts of the folded bracket of FIG. 26.

FIG. 28 is a cross-sectional view illustrating the rotation part of the folded display device of FIG. 25. FIG. 29 is a bottom view illustrating the first and second sliding parts of the folded bracket of FIG. 26.

For convenience of description, FIG. 28 illustrates a cross-sectional view corresponding to the cross-section taken along line II-II' of FIG. 27. Also, FIG. 29 is a plan view corresponding to FIG. 19.

Referring to FIGS. 28 and 29, when the display device DD is folded, since the openings OP overlap the first and second rotation axes RX1 and RX2, the support plate ST overlapping the first and second rotation axes RX1 and RX2 may be easily folded.

If a plurality of support bars for supporting the folding area FA is disposed below the folding area FA, the flatness of the folding area FA may be uneven due to the support bars. In this case, when the folding area FA is folded, the folding area FA may be severely uneven at edges of the support bars, and this may cause damage of the folding area FA. Accordingly, the folding area FA may be deformed.

However, according to an embodiment, the support plate ST and sheet part SHT, each of which has a substantially flat structure, may be disposed below the folding area FA, without the support bars overlapping and/or disposed below the folding area FA. The folding area FA may be easily and/or efficiently supported by the support plate ST, and the flexible sheet part SHT may perform a buffering action between the folding area FA and the support plate ST. Thus, the deformation of the folding area FA may be prevented.

Also, even though the support plate ST is made of a metal material, the portions of the support plate ST, which overlap the first and second rotation axes RX1 and RX2, may be easily folded by the openings OP.

When the display device DD is folded, the rotation parts RP may rotate about the first and second rotation axes RX1 and RX2. In this case, the first hinge part HG1 attached to the supporting plate ST may be pulled upward. The second hinge part HG2 attached to the support plate ST may also be pulled upward. Accordingly, the first and second brackets SP1 and SP2 connected to the first and second hinge parts HG1 and HG2 may also move upward.

The first connection plate CP1 of the first hinge part HG1 may move upward to be adjacent to the third hinge part HG3. The second connection plate CP2 of the second hinge part HG2 may also move upward to be adjacent to the fourth hinge part HG4. Therefore, the second sliding part SL2 connected to each of the first and second hinge parts HG1 and HG2 may also move upward to be adjacent to the first sliding part SL1. That is, the second sliding part SL2 may be slid between the rotation plate RT and the cover part CV to move.

Referring to FIG. 29, as the second sliding part SL2 moves, the second portion PR2 may move toward the first rotation axis RX1. As the second portion PR2 moves, the third teeth part SW3 engaged with the fourth teeth part SW4 of the second portion PR2 may move. The first teeth part SW3 moves in the counterclockwise direction, and as a result, the rotation unit RO may rotate about the sub rotation axis SR in the counterclockwise direction.

As the rotation unit RO rotates, the first teeth part SW1 may move in the counterclockwise direction. As the first teeth SW1 move, the second teeth SW2 engaged with the first teeth SW1 may move away from the first rotation axis RX1. Here, as shown in FIG. 28, the fifth teeth part SW5 may move along the sixth teeth part SW6.

The first sliding part SL1 and the second sliding part SL2 may be moved by the rotation unit RU relative to each other in the first direction DR1 so as to be closer to each other. The first sliding part SL1 may move a shorter distance relative to the distance that the second sliding part SL2 moves.

Only the edge parts EG1 and EG2 may be disposed on the edge of the display device DD adjacent to the hinge HG. If the rotation axis units RU for defining the first and second rotation axes RX1 and RX2 and the rotation parts RP having a sliding structure are implemented at the edge of the display device DD, the edge area may increase. However, in the illustrated exemplary embodiment, since the rotation axis units RU and the rotation parts RP are not disposed at the edge of the display device DD and relatively few elements such as the edge parts EG1 and EG2 are disposed at the edge of the display device DD, the edge of the display device DD may have reduced size and thickness.

As a result, in the display device, the folding area FA may be prevented from being deformed, and the edge area of the display device DD may be reduced.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display module;
a first support part and a second support part disposed below the display module, the first and second support parts being arranged in a first direction;
a hinge disposed between the first and second support parts below the display module to define biaxial rotation axes extending in a second direction intersecting the first direction; and
a plurality of rotation parts coupled to the hinge to rotate about the biaxial rotation axes, the plurality of rotation parts being connected to the first and second support parts, respectively,
wherein at least one of the rotation parts comprises:
a first part coupled to the hinge to rotate about a corresponding rotation axis of the biaxial rotation axes;
a second part coupled to one of the first and second support parts, the second part being spaced apart from the first part in the first direction;
a rotation member coupled to the hinge to rotate about the corresponding rotation axis, and a lost motion connection supporting the first part for movement relative to the rotation member upon rotation of the rotation parts; and
a cover part disposed below the rotation member so as to be connected to the rotation member, wherein the first and second parts are disposed between the rotation member and the cover part.

2. The display device of claim 1, wherein:
the rotation member comprises rotation plate, and
at least one of the rotation parts further comprises a rotation unit disposed between the first and second parts to allow the first and second parts to move relative to each other in the first direction when the rotation parts rotate such that the second part moves a greater length than the first part.

3. The display device of claim 2,
wherein the rotation unit is disposed between the rotation plate and the cover part, and
a portion of the second part is exposed to the outside of the cover part and the rotation plate so as to be connected to the one of the first and second support parts.

4. The display device of claim 3, wherein the first part comprises a first sliding part, the second part comprises a second sliding part, and each of the rotation parts further comprises:
a first protrusion projecting from one surface of the rotation plate facing the cover part and adjacent to the corresponding rotation axis, the first protrusion being inserted into a first sliding hole defined in the first sliding part; and
a second protrusion projecting from the one surface of the rotation plate and further spaced apart from the corresponding rotation axis than the first protrusion in the first direction, the second protrusion being inserted into a second sliding hole defined in the second sliding part,
wherein the first sliding hole has a length greater than that of the first protrusion in the first direction, and the second sliding hole has a length greater than that of the second protrusion in the first direction.

5. The display device of claim 4, wherein the second sliding part comprises:
a first portion in which the second sliding hole is defined; and
a second portion extending from the first portion to the corresponding rotation axis in the first direction, the second portion facing the first sliding part in the second direction,
wherein the rotation unit is disposed between the first sliding part and the second portion so as to be connected to the first sliding part and the second portion, and
when the rotation parts rotate, the rotation unit allows the first sliding part and the first portion to move relative to each other in the first direction.

6. The display device of claim 5, wherein each of the rotation parts further comprises a third protrusion projecting from the one surface of the rotation plate, the third protrusion being inserted into a third sliding hole defined in the second portion, and
the third sliding hole has a length greater than that of the third protrusion in the first direction.

7. The display device of claim 5, wherein each of the rotation parts further comprises a fourth protrusion projecting from the one surface of the rotation plate so as to be disposed between the first sliding part and the second portion, the fourth protrusion being inserted into a rotation hole defined in the rotation unit.

8. The display device of claim 5, wherein the rotation unit comprises:
a first teeth part defined on one side of the rotation unit facing the first sliding part and disposed to be engaged with a second teeth part defined on a portion of the first sliding part; and
a third teeth part defined on the other side of the rotation unit facing the second portion and disposed to be engaged with a fourth teeth part defined on the second portion.

9. The display device of claim 8, wherein the second teeth part and the fourth teeth part extend in the first direction, and
the fourth teeth part has a length greater than that of the second teeth part in the first direction.

10. The display device of claim 8, wherein teeth of the first teeth part are arranged along a first curve having a first curvature, and teeth of the third teeth part are arranged along a second curve having a second curvature, and
the first curvature is greater than the second curvature, and the first curve has a length less than that of the second curve.

11. The display device of claim 3, wherein the hinge comprises:
a central part extending in the second direction;
a rotation axis unit disposed below the central part to define the biaxial rotation axes;
a first hinge part disposed between the first support part and the central part so as to be connected to the first support part; and
a second hinge part disposed between the second support part and the central part so as to be connected to the second support part, wherein the rotation parts are disposed below the first and second hinge parts and coupled to the rotation axis unit to rotate about the biaxial rotation axes.

12. The display device of claim 11, the hinge further comprises a coupling part disposed on the central part and extending in the first direction,
   wherein the rotation plates of the rotation parts are coupled to the rotation axis unit to rotate about the biaxial rotation axes, and
   the rotation member comprises a rotation plate rotatably coupled to both sides of the coupling part, which face opposite to each other in the first direction.

13. The display device of claim 12, wherein the first sliding parts of the rotation parts are rotatably coupled to lower portions of both of the sides of the coupling part to rotate about the biaxial rotation axes.

14. The display device of claim 13, wherein the first sliding parts comprises fifth teeth parts defined on upper portions of the first sliding parts and disposed to be engaged with sixth teeth parts defined on the lower portions of both the sides of the coupling part, respectively, and
   each of the sixth teeth parts is disposed along a virtual curve using each of the biaxial rotation axes as a central point.

15. The display device of claim 11, wherein the portion of the second sliding part, which is exposed to the outside of the cover part and the rotation plate, is connected to a corresponding one of the first and second hinge parts.

16. The display device of claim 11, wherein the hinge further comprises:
   a third hinge part disposed between the central part and the first hinge part; and
   a fourth hinge part disposed between the central part and the second hinge part,
   wherein the third and fourth hinge parts are disposed on the rotation plates of the rotation parts and connected to the rotation plates.

17. The display device of claim 16, wherein the first hinge part comprises:
   a first extension part extending in the second direction and connected to the first support part; and
   a first sub support plate extending from the first extension part to the third hinge part and disposed below the third hinge part,
   wherein the second hinge part comprises:
   a second extension part extending in the second direction and connected to the second support part; and
   a second sub support plate extending from the second extension part to the fourth hinge part and disposed below the third hinge part.

18. The display device of claim 16, further comprising:
   a support member disposed between the first and second support parts and the display module and between the hinge and the display module, and when viewed in a plane, the support member having a plurality of openings overlapping the biaxial rotation axes; and
   a buffer member disposed between the display module and the support member,
   wherein the support member is attached to the central part, the first and second hinge parts, and the first and second support parts.

19. The display device of claim 11, further comprising first edge parts connected to both sides of the central part, which face opposite to each other in the second direction, the first edge parts having flexibility,
   wherein the first edge parts have a plurality of grooves in lower portions of the first edge parts overlapping the biaxial rotation axes.

20. A display device comprising:
   a display module;
   a first support part and a second support part disposed below the display module, the first and second support parts being arranged in a first direction;
   a hinge disposed between the first and second support parts below the display module to define biaxial rotation axes extending in a second direction intersecting the first direction; and
   a plurality of rotation parts coupled to the hinge to rotate about the biaxial rotation axes, the plurality of rotation parts being connected to the first and second support parts, respectively,
   wherein each of the rotation parts comprises:
   a first part coupled to the hinge to rotate about a corresponding rotation axis of the biaxial rotation axes;
   a second part connected to one of the first and second support parts, the second part being spaced apart from the first part in the first direction;
   a rotation member coupled to the hinge to rotate about the corresponding rotation axis; and
   a cover part disposed below the rotation member so as to be connected to the rotation member
   wherein the first and second parts are disposed between the rotation member and the cover part,
   wherein the first part is supported for movement relative to the rotation member upon rotation of the rotation parts, and
   wherein, when the rotation parts rotate, the first and second parts move relative to each other in the first direction such that the second part moves a greater length than the first part.

* * * * *